(12) United States Patent
Mott et al.

(10) Patent No.: US 10,856,455 B1
(45) Date of Patent: Dec. 1, 2020

(54) ELECTROMAGNETIC INTERFERENCE SHIELDING PANELS AND ASSOCIATED METHODS

(71) Applicant: The Boeing Company, Chicago, IL (US)

(72) Inventors: Russell Patrick Mott, Malibu, CA (US); Andrew Paul Nowak, Los Angeles, CA (US); Ashley M. Dustin, Los Angeles, CA (US); Richard E. Sharp, Weldon Spring, MO (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/562,303

(22) Filed: Sep. 5, 2019

(51) Int. Cl.
*H05K 9/00* (2006.01)
*B64D 47/00* (2006.01)

(52) U.S. Cl.
CPC ........... *H05K 9/0086* (2013.01); *B64D 47/00* (2013.01); *B29K 2995/0008* (2013.01); *B29K 2995/0011* (2013.01)

(58) Field of Classification Search
CPC .......... H05K 9/0086; B29K 2995/0011; B29K 2995/0008
See application file for complete search history.

(56) References Cited

U.S. PATENT DOCUMENTS

| | | | | |
|---|---|---|---|---|
| 3,542,939 A | * | 11/1970 | Mintz | H05K 9/0015 277/654 |
| 6,448,491 B1 | * | 9/2002 | Sato | H01L 23/552 174/389 |
| 6,534,707 B1 | * | 3/2003 | Bator | H05K 1/0233 174/353 |
| 2009/0197063 A1 | * | 8/2009 | Uchikiba | H01F 1/26 428/220 |
| 2016/0194459 A1 | * | 7/2016 | Kozar | C08J 5/24 523/201 |
| 2019/0232582 A1 | * | 8/2019 | Nowak | H05K 9/0083 |
| 2019/0292336 A1 | * | 9/2019 | Humfeld | C08G 65/4012 |

* cited by examiner

*Primary Examiner* — Hung V Ngo
(74) *Attorney, Agent, or Firm* — Dascenzo Gates Intellectual Property Law, P.C.

(57) ABSTRACT

Electromagnetic interference (EMI) shielding panels and associated methods. An EMI shielding panel includes a binding matrix material and electrically conductive elements distributed throughout the binding matrix material. The electrically conductive elements are aligned such that conductive element longitudinal axes of the electrically conductive elements are at least substantially parallel to a shielding axis of the EMI shielding panel. The electrically conductive elements are configured to at least partially attenuate an incident electromagnetic wave that is incident upon the EMI shielding panel. A method of forming an EMI shielding panel includes providing a shielding mixture that includes electrically conductive elements distributed throughout an uncured binding matrix material, magnetically aligning the electrically conductive elements, and curing the binding matrix material to form the EMI shielding panel.

20 Claims, 5 Drawing Sheets

ELECTROMAGNETIC INTERFERENCE SHIELDING PANELS AND ASSOCIATED METHODS

FIELD

The present disclosure relates to electromagnetic interference shielding panels and associated methods.

BACKGROUND

Electromagnetic interference (EMI) shielding describes the practice of reducing the magnitude of an electromagnetic (EM) field within a space by blocking and/or attenuating the EM field with electrically conductive and/or magnetic materials. EMI shielding typically is applied to enclosures to isolate electrical devices from interference by unwanted EM fields, as well as to electrical cables to isolate wires from the environment through which the cable runs. EMI shielding that blocks radio frequency (RF) EM radiation also is known as RF shielding. RF shielding may be utilized to reduce a coupling of radio waves, EM fields, and electrostatic fields. Common solutions involve surrounding a space in a conductive material, thus forming a Faraday cage around the space. Such solutions generally involve enclosing the space with an electrically conductive and/or magnetic material, such as a continuous foil or wire mesh grid. However, such materials often are heavy and/or rigid, resulting in weight penalties and/or manufacturing difficulties when incorporating such materials into vehicles such as aircraft.

SUMMARY

Electromagnetic interference (EMI) shielding panels and associated methods are disclosed herein. An EMI shielding panel comprises a binding matrix material and electrically conductive elements distributed throughout the binding matrix material. Each electrically conductive element has a respective conductive element longitudinal axis, and the electrically conductive elements are aligned such that the conductive element longitudinal axes are at least substantially parallel to a shielding axis of the EMI shielding panel. The electrically conductive elements are configured to at least partially attenuate an incident electromagnetic wave that is incident upon the EMI shielding panel along a direction that is at least substantially parallel to the shielding axis. The EMI shielding panel extends substantially within a panel plane that defines a panel transverse axis that extends perpendicular to the panel plane, and the shielding axis is at least substantially parallel to the panel transverse axis. In some examples, the EMI shielding panel is flexible.

A method of forming an EMI shielding panel comprises providing a shielding mixture that includes electrically conductive elements distributed throughout an uncured binding matrix material, magnetically aligning the electrically conductive elements, and curing the binding matrix material to form the EMI shielding panel. The magnetically aligning the electrically conductive elements includes aligning the electrically conductive elements such that conductive element longitudinal axes of the electrically conductive elements are at least substantially parallel to one another.

DESCRIPTION

Figure 1:
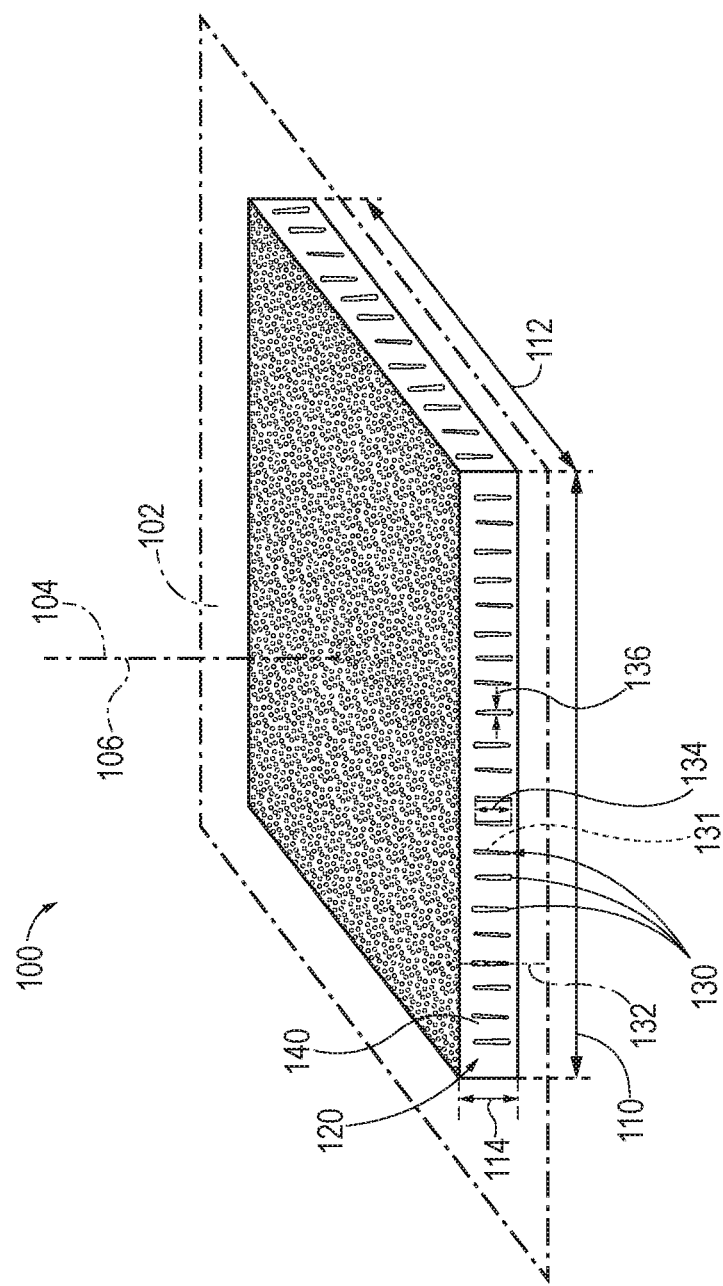
FIG. 1 is a schematic top isometric view illustrating examples of electromagnetic interference (EMI) shielding panels according to the present disclosure.

FIGS. 1-7 provide illustrative, non-exclusive examples of electromagnetic interference (EMI) shielding panels 100, of aircraft 10 including EMI shielding panels, and/or of methods 300 of producing EMI shielding panels 100, according to the present disclosure. Elements that serve a similar, or at least substantially similar, purpose are labeled with like numbers in each of FIGS. 1-7, and these elements may not be discussed in detail herein with reference to each of FIGS. 1-7. Similarly, all elements may not be labeled in each of FIGS. 1-7, but reference numerals associated therewith may be utilized herein for consistency. Elements, components, and/or features that are discussed herein with reference to one or more of FIGS. 1-7 may be included in and/or utilized with any of FIGS. 1-7 without departing from the scope of the present disclosure. Generally, in the figures, elements that are likely to be included in a given example are illustrated in solid lines, while elements that are optional to a given example are illustrated in dashed lines. However, elements that are illustrated in solid lines are not essential to all examples of the present disclosure, and an element shown in solid lines may be omitted from a given example without departing from the scope of the present disclosure.

The present disclosure generally is directed to EMI shielding panels 100 that are operable to at least partially attenuate an incident electromagnetic wave, as well as methods 300 of generating such EMI shielding panels 100. As schematically illustrated, in FIG. 1, an EMI shielding panel 100 includes a binding matrix material 140 and electrically conductive elements 130 distributed throughout binding matrix material 140. As described in more detail herein, electrically conductive elements 130 are substantially aligned with one another such that EMI shielding panel 100 exhibits the desired EMI shielding characteristics. As additionally described in more detail herein, methods 300 of forming EMI shielding panels generally include magnetically aligning electrically conductive elements 130 within binding matrix material 140 prior to curing binding matrix material 140 to maintain electrically conductive elements 130 in the aligned configuration. In some examples, and as further described in more detail herein, methods 300 include selectively extruding binding matrix material 140 from a magnetic field region to increase a particle volume density of electrically conductive elements 130 within the magnetic field region.

As discussed, FIG. 1 schematically illustrates an EMI shielding panel 100 that includes binding matrix material 140 and electrically conductive elements 130 distributed throughout binding matrix material 140. In this manner, binding matrix material 140 and electrically conductive elements 130 collectively may be referred to as a shielding mixture 120, as discussed in more detail below. As schematically illustrated in FIG. 1, each electrically conductive element 130 has a respective conductive element longitudinal axis 132, and electrically conductive elements 130 are aligned such that the conductive element longitudinal axes 132 are at least substantially parallel to a shielding axis 106 of EMI shielding panel 100. In this manner, electrically conductive elements 130 collectively are configured to at least partially attenuate an incident electromagnetic (EM) wave that is incident upon EMI shielding panel 100 along a direction that is at least partially parallel to shielding axis 106. In particular, and as will be understood by one skilled in the art of EMI shielding, an incident EM wave that is incident upon a given electrically conductive element 130 along a direction at least partially parallel to the respective conductive element longitudinal axis 132 will induce an electrical current within the given electrically conductive element 130 that operates to at least partially attenuate the incident EM wave. Accordingly, distributing a plurality of electrically conductive elements 130 across an area of EMI shielding panel 100 may yield such an attenuation of EM waves incident upon any portion of EMI shielding panel 100.

EMI shielding panel 100 may exhibit any appropriate degree of attenuation of the incident EM wave. As examples, EMI shielding panel 100 may be configured to attenuate the incident EM wave by at least 10 decibels (dB), at least 20 dB, at least 30 dB, at least 60 dB, at least 80 dB, at most 100 dB, at most 70 dB, at most 50 dB, at most 25 dB, and/or at most 15 dB. Additionally or alternatively, EMI shielding panel 100 may be configured to attenuate the incident EM wave when the incident EM wave has a wavelength that is at least 100 nanometers (nm), at least 1 micrometer (μm), at least 10 μm, at least 100 μm, at least 0.1 centimeter (cm), at least 1 cm, at least 10 cm, at least 100 cm, at least 1 meter (m), at least 10 m, at least 100 m, at least 1 kilometer (km), at most 5 km, at most 500 m, at most 50 m, at most 5 m, at most 50 cm, at most 5 cm, at most 0.5 cm, at most 50 μm, at most 5 μm, and/or at most 500 nm.

EMI shielding panel 100 may have any appropriate configuration and/or shape. For example, and as schematically illustrated in FIG. 1, EMI shielding panel 100 may be described as extending at least substantially within a panel plane 102 that defines a panel transverse axis 104 that extends perpendicular to panel plane 102 such that shielding axis 106 is at least substantially parallel to panel transverse axis 104. While the examples described herein generally pertain to examples in which EMI shielding panel 100 extends at least substantially parallel to panel plane 102, this is not required of all examples of EMI shielding panel 100 in all circumstances, and it is additionally within the scope of the present disclosure that EMI shielding panel 100 may depart from a substantially planar configuration. For example, in some examples, EMI shielding panel 100 is flexible and/or resiliently flexible. In such examples, EMI shielding panel 100 may be formed and/or configured to be nominally planar but may be selectively deformed and/or bent, such as to facilitate installing EMI shielding panel 100 onto curved surfaces. Stated differently, in such examples, EMI shielding panel 100 may extend at least substantially within panel plane 102 and also may be selectively deformed and/or bent to a non-planar configuration. Such a configuration also may facilitate EMI shielding panel 100 attenuating incident EM radiation that is incident upon EMI shielding panel 100 from a plurality of distinct directions. Additionally, while the examples described herein generally pertain to examples in which EMI shielding panel 100 is substantially rectangular and/or square, this is not required of all examples of EMI shielding panel 100, and it is additionally within the scope of the present disclosure that EMI shielding panel 100 may assume any appropriate shape. In some examples, it may be desirable that EMI shielding panel 100 has a shape that is selected such that a plurality of EMI shielding panels 100 may tile a given surface without overlap of the panels.

EMI shielding panel 100 may have any appropriate dimensions, such as may be selected to enhance a flexibility of EMI shielding panel 100 and/or to facilitate installation of EMI shielding panels 100 upon a surface. For example, and as schematically illustrated in FIG. 1, EMI shielding panel 100 may have a panel thickness 114, as measured along a direction parallel to panel transverse axis 104, that is at least 0.1 millimeters (mm), at least 0.5 mm, at least 1 mm, at least 5 mm, at least 10 mm, at most 15 mm, at most 7 mm, at most 2 mm, at most 0.7 mm, and/or at most 0.2 mm. Additionally or alternatively, and as further schematically illustrated in FIG. 1, EMI shielding panel 100 may have a first linear dimension 110, as measured along a direction parallel to panel transverse axis 104, and a second linear dimension 112, as measured along a direction that is perpendicular to each of panel transverse axis 104 and first linear dimension 110, such that one or both of first linear dimension 110 and second linear dimension 112 is at least 1 cm, at least 3 cm, at least 5 cm, at least 10 cm, at least 15 cm, at least 20 cm, at least 30 cm, at least 50 cm, at least 100 cm, at most 200 cm, at most 75 cm, at most 40 cm, at most 25 cm, at most 17 cm, at most 12 cm, at most 7 cm, and/or at most 2 cm. In an example in which EMI shielding panel 100 is not substantially rectangular within panel plane 102, first linear dimension 110 and second linear dimension 112 may refer to any appropriate respective linear dimensions corresponding to EMI shielding panel 100. For example, first linear dimension 110 and second linear dimension 112 may correspond to respective linear dimensions of a smallest rectangle parallel to panel plane 102 that circumscribes EMI shielding panel 100. Additionally or alternatively, first linear dimension 110 and second linear dimension 112 may correspond to respective linear dimensions measured within EMI shielding panel 100 and parallel to panel plane 102. EMI shielding panel 100 also may be characterized by a panel area, as measured within panel plane 102, that is at least 1 cm$^2$, at least 10 cm$^2$, at least 100 cm$^2$, at least 1,000 cm$^2$, at least 10,000, at most 50,000 cm$^2$, at most 5,000 cm$^2$, at most 500 cm$^2$, at most 50 cm$^2$, and/or at most 5 cm$^2$.

Each electrically conductive element 130 may be formed of any appropriate electrically conductive material, examples of which include a wire, a magnetic material, a paramagnetic material, a ferromagnetic material, iron, nickel, a permalloy, an iron silicon alloy, cobalt, and/or an iron cobalt alloy. Each electrically conductive element 130 also may be characterized in terms of an electrical conductivity thereof. As examples, each electrically conductive element 130 may have an electrical conductivity that is at least 100 siemens per meter (S/m), at least 1,000 S/m, at least 10,000 S/m, at least 100,000 S/m, at least 1,000,000 S/m, at least 10,000,000 S/m, at least 100,000,000 S/m, at most 500,000,000 S/m, at most 50,000,000 S/m, at most 5,000,000 S/m, at most 500,000 S/m, at most 50,000 S/m, at most 5,000 S/m, and/or at most 500 S/m.

In some examples, it may be desirable that electrically conductive elements 130 be electrically insulated from one another, such as to prevent the electrically conductive elements 130 from electrically shorting out against one another. That is, configuring EMI shielding panel 100 such that electrically conductive elements 130 are electrically insulated and/or isolated from one another may enhance the shielding properties of EMI shielding panel 100 relative to a panel in which at least some electrically conductive elements 130 are in electrical contact with one another. Accordingly, and as schematically illustrated in FIG. 1, each electrically conductive element 130 may be at least substantially coated by a non-conductive layer 131 that at least substantially electrically insulates the electrically conductive elements 130 from one another. Non-conductive layer 131 may include and/or be any appropriate material for electrically insulating electrically conductive elements 130 from one another, examples of which include a cellulosic material, carboxymethyl cellulose, hydropropyl cellulose, hydroxypropyl methyl cellulose, and/or polyvinylpyrrolidone. Additionally, non-conductive layer 131 may at least substantially coat each electrically conductive element 130 in any appropriate manner. For example, non-conductive layer 131 may have a thickness that is at least substantially uniform around an exterior surface of each electrically conductive element 130. As more specific examples, non-conductive layer 131 may have a thickness that is at least 0.1 micrometers (μm), at least 0.3 μm, at least 0.5 μm, at least 1 μm, at least 3 μm, at least 5 μm, at least 10 μm, at least 30 μm, at most 50 μm, at most 20 μm, at most 7 μm, at most 2 μm, at most 0.7 μm, and/or at most 0.2 μm.

With continued reference to FIG. 1, each electrically conductive element 130 additionally may be characterized by one or more linear dimensions thereof. For example, and as schematically illustrated in FIG. 1, each electrically conductive element 130 may have a conductive element length 134, as measured along a direction parallel to the respective conductive element longitudinal axis 132, that is at least 10 μm, at least 50 μm, at least 100 μm, at least 500 μm, at least 1 mm, at most 5 mm, at most 700 μm, at most 200 μm, at most 70 μm, and/or at most 20 μm. Additionally or alternatively, and as further schematically illustrated in FIG. 1, each electrically conductive element 130 may have a conductive element diameter 136, as measured along a direction perpendicular to the respective conductive element longitudinal axis 132, that is at least 100 nm, at least 500 nm, at least 1 μm, at least 5 μm, at least 10 μm, at least 50 μm, at least 100 μm, at least 500 μm, at most 1 mm, at most 700 μm, at most 200 μm, at most 70 μm, at most 20 μm, at most 7 μm, at most 2 μm, at most 700 nm, and/or at most 200 nm. Additionally or alternatively, each electrically conductive element 130 may have a conductive element aspect ratio that is at least 2:1, at least 5:1, at least 10:1, at least 50:1, at least 100:1, at least 500:1, at least 1,000:1, at most 2,000:1, at most 700:1, at most 200:1, at most 70:1, at most 20:1, at most 7:1, and/or at most 3:1. In some examples, the conductive element aspect ratio of a given electrically conductive element 130 is defined as a ratio of the respective conductive element length 134 to the respective conductive element diameter 136.

Binding matrix material 140 also may include and/or be any appropriate material, examples of which include a dielectric material, a polymer, a resin, an epoxy resin, a curable epoxy resin, and/or a low-viscosity epoxy resin. As described in more detail below, such materials may be selected such that electrically conductive elements 130 are at least partially mobile within binding matrix material 140 until binding matrix material 140 is set and/or cured, and such that binding matrix material 140 maintains electrically conductive elements 130 in a substantially aligned orientation subsequent to being set and/or cured.

Electrically conductive elements 130 may be distributed within binding matrix material 140 in any appropriate manner. For example, and as schematically illustrated in FIG. 1, electrically conductive elements 130 may be at least substantially evenly distributed throughout binding matrix material 140 and/or may be at least partially spaced apart from each other within binding matrix material 140. EMI shielding panel 100 also may be characterized in terms of a conductive element mass fraction, defined as a proportion of a total mass of EMI shielding panel 100 that is formed by electrically conductive elements 130. As examples, the conductive element mass fraction of EMI shielding panel 100 may be at least 1%, at least 3%, at least 5%, at least 10%, at least 15%, at least 20%, at least 30%, at most 50%, at most 25%, at most 17%, at most 12%, at most 7%, and/or at most 2%.

Turning now to FIGS. 2-6, FIG. 2 is a flowchart depicting methods 300, according to the present disclosure, of forming an EMI shielding panel (such as EMI shielding panel 100), while FIGS. 3-6 provide schematic representations of aspects of methods 300 according to the present disclosure. In this manner, while FIGS. 3-6 schematically depict aspects of methods 300 and of components utilized to perform such methods, the examples of FIGS. 3-6 are not limiting, and it is additionally within the scope of the present disclosure that methods 300 may utilize and/or be performed in conjunction with any appropriate components. As examples, methods 300 may utilize and/or be performed in conjunction with at least a subset of the components that are schematically illustrated in FIGS. 3-6, components functionally analogous to those schematically illustrated in FIGS. 3-6, and/or additional or alternative components relative to those schematically illustrated in FIGS. 3-6. Additionally, while methods 300 generally are discussed in conjunction with reference numerals corresponding to the schematic examples of FIGS. 1 and 3-6, this is not limiting, and it is additionally within the scope of the present disclosure that methods 300 may be performed with any appropriate components.

Figure 2:
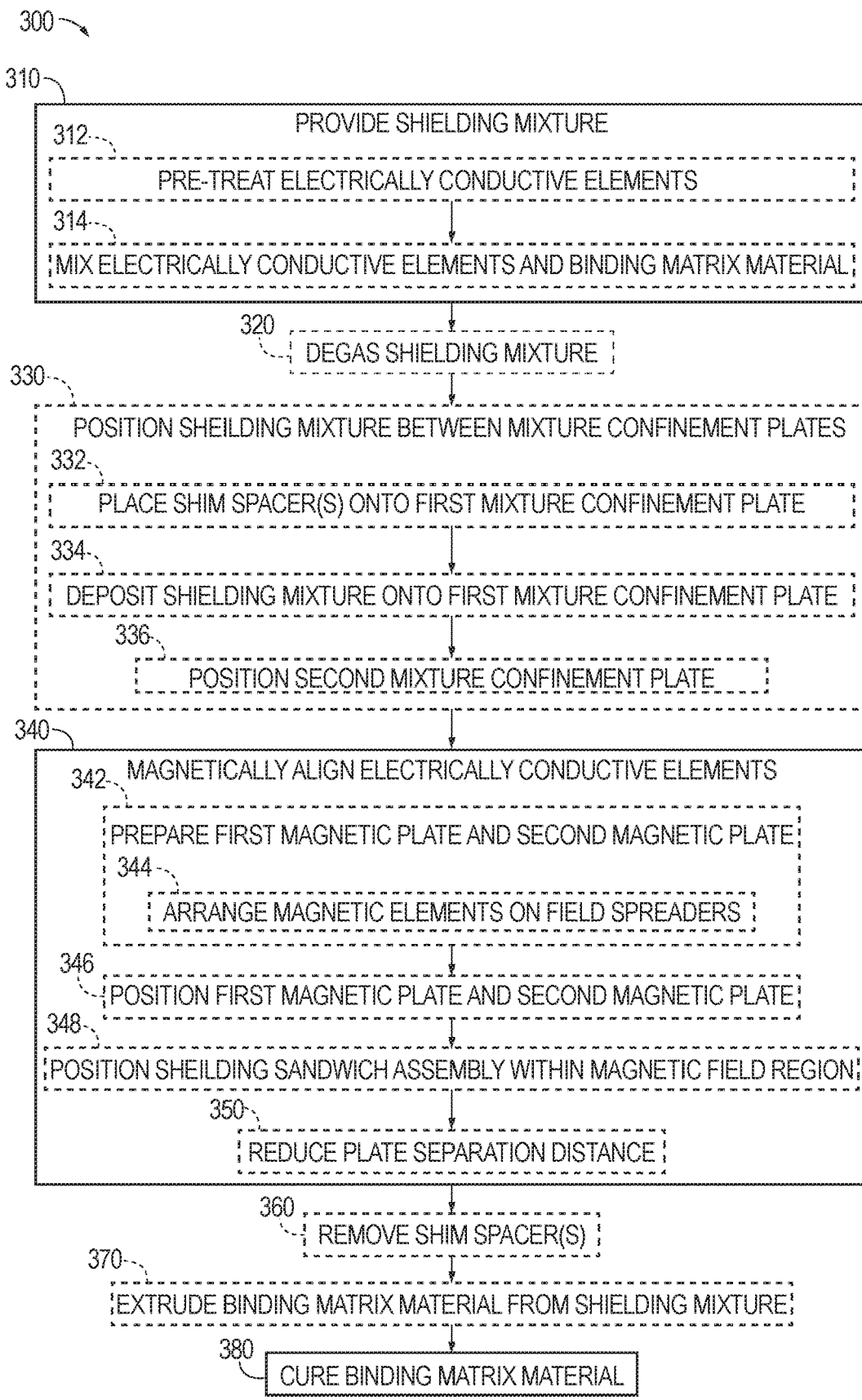
FIG. 2 is a flowchart depicting methods of forming EMI shielding panels according to the present disclosure.

As shown in FIG. 2, a method 300 includes providing, at 310, a shielding mixture (such as shielding mixture 120) that includes electrically conductive elements (such as electrically conductive elements 130) distributed throughout an uncured binding matrix material (such as binding matrix material 140 prior to being cured and/or set) and magnetically aligning, at 340, electrically conductive elements 130. More specifically, and as discussed, each electrically conductive element 130 has a conductive element longitudinal axis (such as conductive element longitudinal axis 132), and the magnetically aligning at 340 includes aligning electrically conductive elements 130 such that conductive element longitudinal axes 132 are at least substantially parallel to one another. As further shown in FIG. 2, method 300 further includes curing, at 380, binding matrix material 140 to form EMI shielding panel 100.

Figure 3:
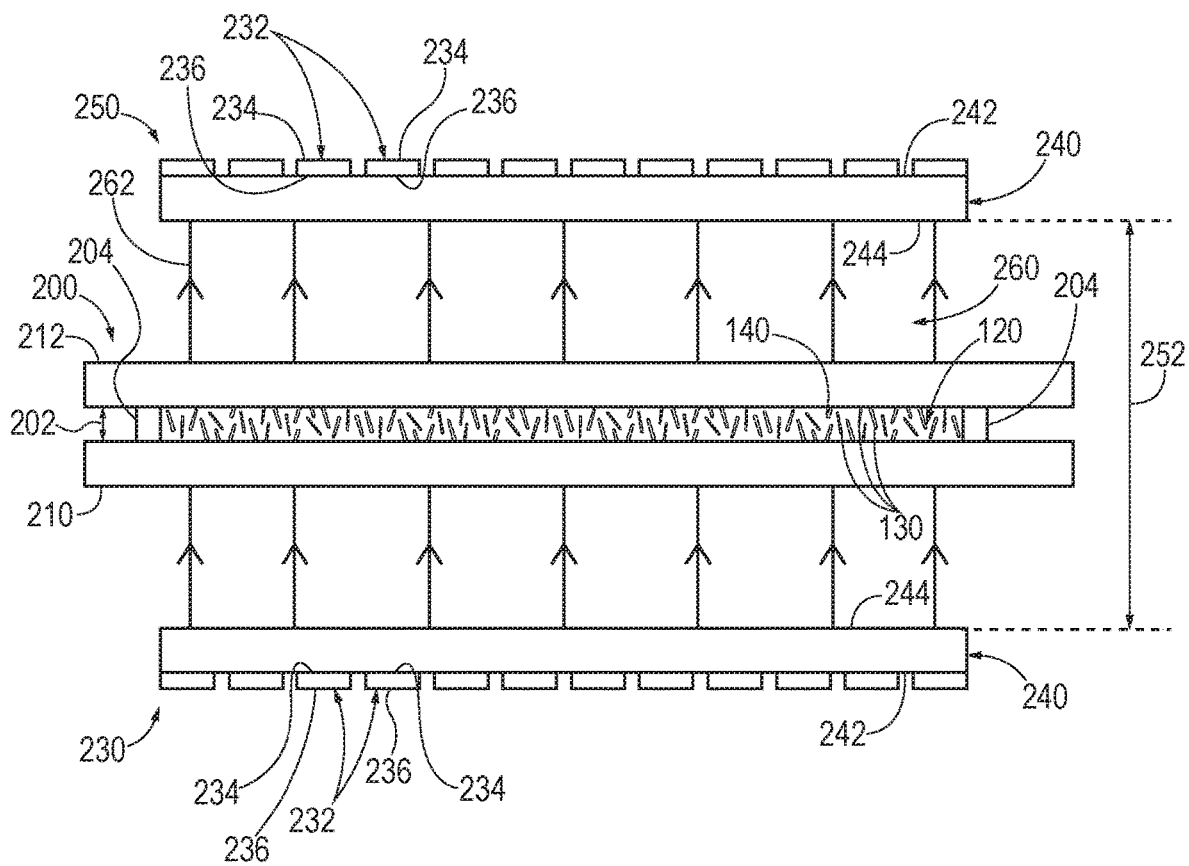
FIG. 3 is a schematic side elevation view illustrating an example step of a method of forming an EMI shielding panel according to the present disclosure.
Figure 4:
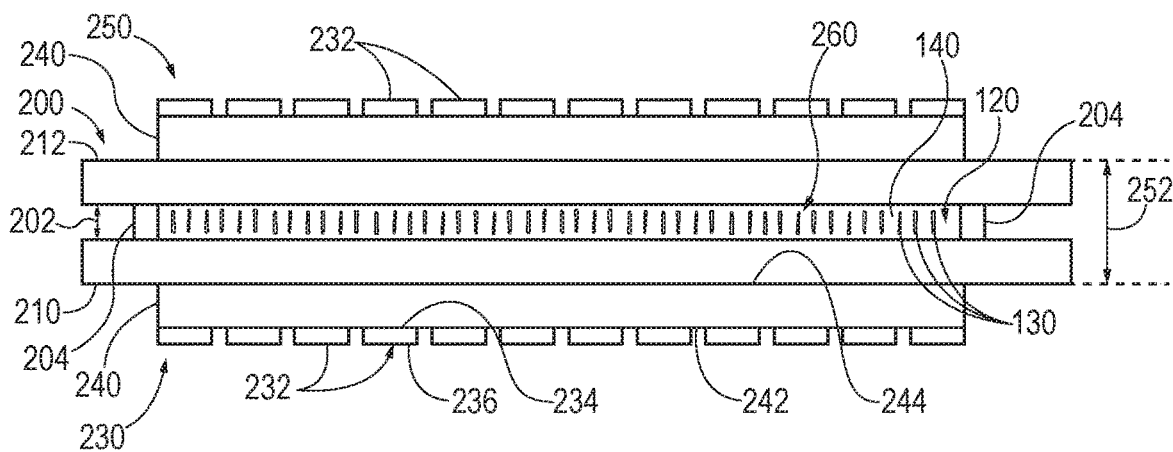
FIG. 4 is a schematic side elevation view illustrating another example step of a method of forming an EMI shielding panel according to the present disclosure.

The magnetically aligning the electrically conductive elements at 340 may be performed in any appropriate manner. In some examples, and as shown in FIG. 2, method 300 additionally includes, prior to the magnetically aligning at 340, positioning, at 330, shielding mixture 120 between a first mixture confinement plate (such as first mixture confinement plate 210 schematically illustrated in FIGS. 3-4)

and a second mixture confinement plate (such as second mixture confinement plate 212 schematically illustrated in FIGS. 3-4) to yield a shielding sandwich assembly (such as shielding sandwich assembly 200 schematically illustrated in FIGS. 3-4) that includes shielding mixture 120 positioned between first mixture confinement plate 210 and second mixture confinement plate 212. In such examples, and as shown in FIG. 2, the magnetically aligning at 340 may include positioning, at 346, a first magnetic plate (such as first magnetic plate 230 schematically illustrated in FIGS. 3-4) and a second magnetic plate (such as second magnetic plate 250 schematically illustrated in FIGS. 3-4) to produce a magnetic field (such as magnetic field 262 schematically illustrated in FIG. 3) within a magnetic field region (such as magnetic field region 260 schematically illustrated in FIGS. 3-4) that extends between first magnetic plate 230 and second magnetic plate 250 and subsequently positioning, at 348, shielding sandwich assembly 200 within magnetic field region 260. Specifically, in such examples, and as schematically illustrated in FIG. 3, the positioning at 346 may include positioning first magnetic plate 230 and second magnetic plate 250 such that first magnetic plate 230 and second magnetic plate 250 are substantially parallel to one another and such that magnetic field 262 between first magnetic plate 230 and second magnetic plate 250 yields an attractive magnetic force that biases first magnetic plate 230 and second magnetic plate 250 toward one another.

When shielding sandwich assembly 200 is positioned within magnetic field region 260, magnetic field 262 within magnetic field region 260 may operate to align electrically conductive elements 130, as described herein. Specifically, each electrically conductive element 130 may be configured such that, in the presence of an applied magnetic field (such as magnetic field 262 schematically illustrated in FIG. 3), a magnetic field is induced within electrically conductive element 130 in the direction of applied magnetic field 262. In an example in which an electrically conductive element 130 is elongate (e.g., with a conductive element aspect ratio as discussed herein) and has conductive element longitudinal axis 132 that is not aligned with applied magnetic field 262, an interaction between applied magnetic field 262 and the induced magnetic field may produce a torque on electrically conductive element 130 that operates to align conductive element longitudinal axis 132 with applied magnetic field 262. In this manner, applying a magnetic field to the shielding mixture 120 (such as via the positioning at 348) may have the effect of aligning electrically conductive elements 130 such that the respective conductive element longitudinal axes 132 are at least substantially parallel to applied magnetic field 262.

Figure 5:
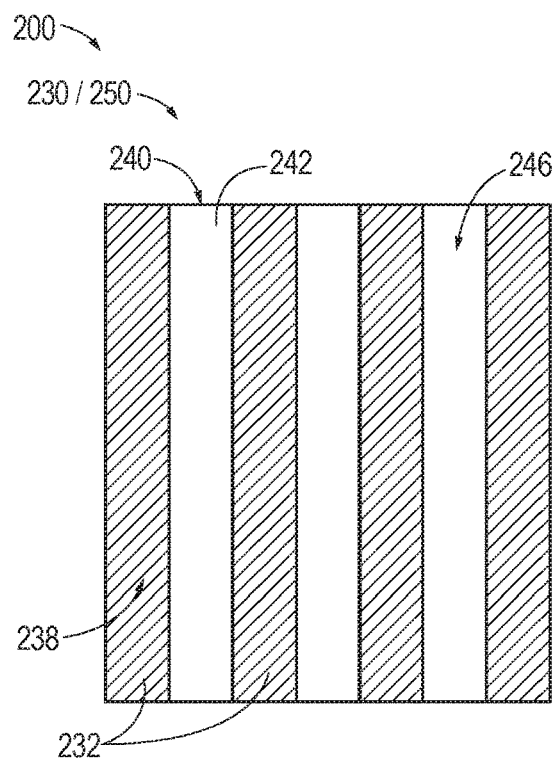
FIG. 5 is a schematic top plan view illustrating an example of a first magnetic plate or a second magnetic plate that may be utilized in conjunction with methods of forming an EMI shielding panel according to the present disclosure.
Figure 6:
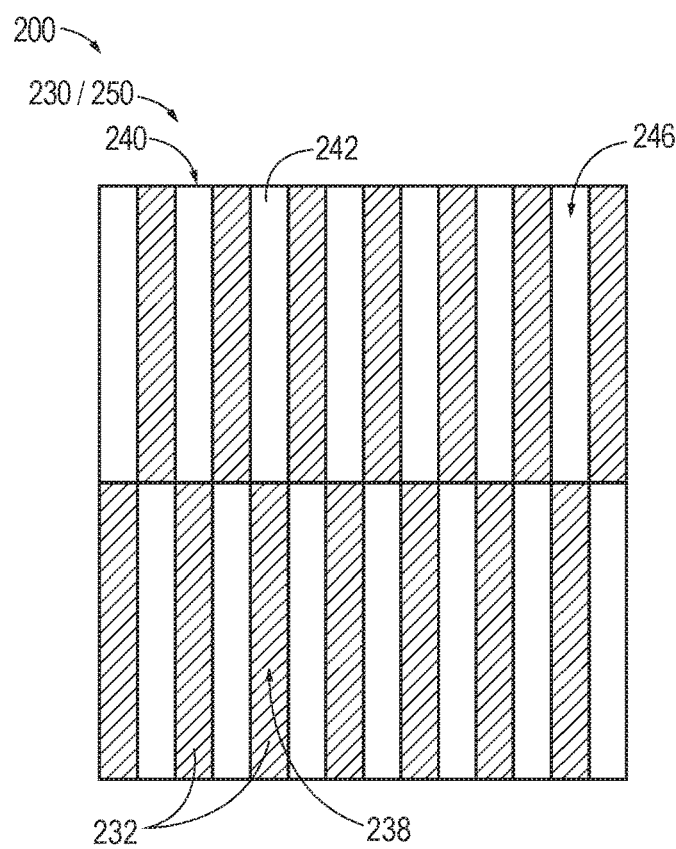
FIG. 6 is a schematic top plan view illustrating another example of a first magnetic plate or a second magnetic plate that may be utilized in conjunction with methods of forming an EMI shielding panel according to the present disclosure.

As discussed, FIGS. 3-6 provide schematic representations of aspects of methods 300 according to the present disclosure. Specifically, FIGS. 3-4 schematically illustrate an example of shielding sandwich assembly 200 in which shielding mixture 120 is positioned between first mixture confinement plate 210 and second mixture confinement plate 212 and in which shielding sandwich assembly 200 is positioned within magnetic field region 260 that includes magnetic field 262 produced between first magnetic plate 230 and second magnetic plate 250. In this manner, each of FIGS. 3-4 may be described as schematically illustrating a portion of method 300 subsequent to the positioning first magnetic plate 230 and second magnetic plate 250 at 346 and the positioning shielding sandwich assembly 200 within magnetic field region 260 at 348. Aspects of each of shielding sandwich assembly 200, first magnetic plate 230, and/or second magnetic plate 250 as illustrated in FIGS. 3-4 are discussed in more detail below with reference to further aspects of method 300. Additionally, FIGS. 5-6 schematically illustrate examples of first magnetic plate 230 and/or second magnetic plate 250, such as may be included in shielding sandwich assembly 200 of FIGS. 3-4, as described in more detail below.

The providing the shielding mixture at 310 may include acquiring and/or preparing shielding mixture 120 in any appropriate manner. For example, and as shown in FIG. 2, the providing at 310 may include pre-treating, at 312, electrically conductive elements 130 with a non-conductive layer (such as non-conductive layer 131). In such examples, the pre-treating at 312 may include coating electrically conductive elements 130 with non-conductive layer 131 in any appropriate manner. For example, the pre-treating at 312 may include coating each electrically conductive element 130 with non-conductive layer 131 such that electrically conductive elements 130 are at least substantially electrically insulated from one another. Additionally or alternatively, the pre-treating at 312 may include coating each electrically conductive element 130 with non-conductive layer 131 such that a thickness of non-conductive layer 131 on each electrically conductive element 130 is at least substantially uniform. The pre-treating at 312 may be performed via any appropriate process, such as a Wurster fluid bed process.

As further shown in FIG. 2, the providing the shielding mixture at 310 additionally or alternatively may include mixing, at 314, electrically conductive elements 130 and binding matrix material 140, such as with a centrifugal mixer, a dispersion disc, a paddle mixer, and/or an ultrasonic mixture. The providing the shielding mixture at 310 may result in shielding mixture 120 having any appropriate relative amounts of electrically conductive elements 130 and binding matrix material 140. For example, the providing at 310 may include providing such that shielding mixture 120 has a conductive element particle volume fraction of electrically conductive elements 130, defined as a proportion of a total volume of shielding mixture 120 that is formed by electrically conductive elements 130, that is at least 5%, at least 10%, at least 30%, at least 50%, at most 60%, at most 40%, at most 20%, and/or at most 7%. Additionally or alternatively, the providing at 310 may include providing such that shielding mixture 120 has a conductive element mass fraction, defined as a proportion of a total mass of shielding mixture 120 that is formed by electrically conductive elements 130, that is at least 1%, at least 3%, at least 5%, at least 10%, at least 15%, at least 20%, at least 30%, at most 50%, at most 25%, at most 17%, at most 12%, at most 7%, and/or at most 2%. Shielding mixture 120 also may be characterized in terms of a viscosity thereof, such as prior to the curing at 380. As examples, the providing at 310 may include providing such that shielding mixture 120 has a viscosity that is at least 10 centiPoise, at least 100 centiPoise, at least 1,000 centiPoise, at least 10,000 centiPoise, at most 50,000 centiPoise, at most 5,000 centiPoise, at most 500 centiPoise, and/or at most 50 centiPoise. In some examples, the providing at 310 includes providing such that shielding mixture 120 includes a curative, such as may facilitate the curing of the binding matrix material at 380. In an example of method 300 in which the providing the shielding mixture at 310 includes the pre-treating at 312 and the mixing at 314, the mixing at 314 may be performed subsequent to the pre-treating at 312.

As further shown in FIG. 2, method 300 additionally may include, prior to the magnetically aligning the electrically conductive elements at 340, degassing, at 320, the shielding mixture. For example, the degassing at 320 may include degassing shielding mixture 120 to remove gases from shielding mixture 120 that otherwise may form voids within shielding mixture 120 and/or may disrupt a uniformity and/or alignment of electrically conductive elements 130 within shielding mixture 120. The degassing at 320 may be performed in any appropriate manner. As examples, the degassing at 320 may be performed at room temperature and/or at a temperature that is at least 30° C., at least 50° C., at least 100° C., at most 120° C., at most 70° C., and/or at most 40° C. Additionally or alternatively, the degassing at 320 may include applying a vacuum to shielding mixture 120.

The positioning the shielding mixture between the first mixture confinement plate and the second mixture confinement plate at 330 may utilize any appropriate components. For example, in some examples, one or both of first mixture confinement plate 210 and second mixture confinement plate 212 is a glass plate. Utilizing glass plates in this manner may facilitate visual inspection of shielding mixture 120 within shielding sandwich assembly 200 and/or may facilitate positioning shielding mixture 120 against the glass plate without forming air pockets at the interface of shielding mixture 120 and the glass plate. As schematically illustrated in FIGS. 3-4, and as discussed in more detail below, each of first mixture confinement plate 210 and second mixture confinement plate 212 may be substantially equal in size to, or larger than, each of first magnetic plate 230 and second magnetic plate 250, such as in a dimension that is at least substantially perpendicular to magnetic field 262.

The positioning the shielding mixture between the first mixture confinement plate and the second mixture confinement plate at 330 also may be performed in any appropriate manner. In some examples, and as shown in FIG. 2, the positioning the shielding mixture at 330 includes placing, at 332, one or more shim spacers (such as shim spacers 204 schematically illustrated in FIGS. 3-4) onto the first mixture confinement plate; depositing, at 334, the shielding mixture onto the first confinement plate;

and/or positioning, at 336, the second mixture confinement plate such that the second mixture confinement plate is in contact with at least a subset of the shim spacers and with the shielding mixture. In some examples, the placing the one or more shim spacers at 332 includes at least substantially surrounding shielding mixture 120 with shim spacer(s) 204, such as to confine shielding mixture 120 to a region partially defined by shim spacer(s) 204. Shim spacer(s) 204 additionally or alternatively may be configured to maintain a confinement plate separation distance (such as confinement plate separation distance 202 schematically illustrated in FIGS. 3-4) between first mixture confinement plate 210 and second mixture confinement plate 212. As more specific examples, shim spacer(s) 204 may be configured to separate first mixture confinement plate 210 and second mixture confinement plate 212 such that confinement plate separation distance 202 is at least 0.1 mm, at least 0.5 mm, at least 1 mm, at least 5 mm, at least 1 cm, at least 5 cm, at least 10 cm, at most 15 cm, at most 7 cm, at most 2 cm, at most 7 mm, at most 2 mm, at most 0.7 mm, and/or at most 0.2 mm. In this manner, first mixture confinement plate 210, second mixture confinement plate 212, and shim spacer(s) 204 collectively may at least partially define physical dimensions of EMI shielding panel 100 formed via method 300, such as first linear dimension 110, second linear dimension 112, and/or panel thickness 114, as schematically illustrated in FIG. 1. Each shim spacer 204 may have any appropriate configuration and/or material characteristics. As examples, each shim spacer 204 may be porous, nonporous, rigid, and/or compressible.

Subsequent to forming EMI shielding panel 100 via an example of method 300 described herein, EMI shielding panel 100 is separated from first mixture confinement plate 210 and second mixture confinement plate 212. Accordingly, to facilitate this separation, the positioning at 330 may include, prior to the depositing the shielding mixture at 334, treating first mixture confinement plate 210 with a mold release. Similarly, the positioning at 330 may include, prior to the positioning second mixture confinement plate 212, treating second mixture confinement plate 212 with the mold release.

As discussed, it generally may be desirable to assemble shielding sandwich assembly 200 in a manner that avoids forming voids such as air pockets and/or bubbles at the interface of shielding mixture 120 and either of first mixture confinement plate 210 and second mixture confinement plate 212. For example, such air pockets may operate to introduce a boundary condition whereby one or more of electrically conductive elements 130 may be preferentially attracted to and/or attached to such air pockets, such as via surface energy effects, thus adversely affecting the uniformity and/or alignment of electrically conductive elements 130 within shielding mixture 120. Additionally, such air pockets at the interface of shielding mixture 120 and either of first mixture confinement plate 210 and second mixture confinement plate 212 may produce an uneven surface on the resultant EMI shielding panel 100, necessitating further processing steps to produce a smooth panel surface of EMI shielding panel 100. Accordingly, the positioning the shielding mixture between the first mixture confinement plate and the second mixture confinement plate at 330 and/or the positioning the second mixture confinement plate at 336 may include one or more steps configured to avoid formation of voids such as air pockets and/or bubbles. For example, the positioning the second mixture confinement plate at 336 may include contacting shielding mixture 120 with second mixture confinement plate 212 such that a region defined by first mixture confinement plate 210, second mixture confinement plate 212, and shim spacer(s) 204 is substantially free of voids that are unoccupied by shielding mixture 120. In some examples, in order to enhance a uniformity of contact between shielding mixture 120 and second mixture confinement plate 212, the positioning the second mixture confinement plate at 336 includes tilting second mixture confinement plate 212 from an orientation in which second mixture confinement plate 212 is oblique to first mixture confinement plate 210 to an orientation in which second mixture confinement plate 212 is substantially parallel to first mixture confinement plate 210.

With continued reference to FIG. 2, in some examples, the magnetically aligning the electrically conductive elements at 340 includes, prior to the positioning the first magnetic plate and the second magnetic plate at 346, preparing, at 342, each of the first magnetic plate and the second magnetic plate. As an example, and as schematically illustrated in FIGS. 3-6, each of first magnetic plate 230 and second magnetic plate 250 may include a respective field spreader 240 and a respective plurality of magnetic elements 232 positioned on the respective field spreader 240. In such examples, and as shown in FIG. 2, the preparing at 342 may include arranging, at 344, each respective plurality of magnetic elements on each respective field spreader.

Each field spreader 240 and each respective plurality of magnetic elements 232 may have any appropriate form and/or configuration, such as to produce a substantially uniform magnetic field 262 between first magnetic plate 230 and second magnetic plate 250. For example, each magnetic element 232 may be intrinsically magnetized (i.e., may independently generate a magnetic field), and each field spreader 240 may be configured to be magnetized in the presence of the respective plurality of magnetic elements 232. In this manner, field spreader 240 may yield a magnetic field that derives from the magnetization of each of the respective plurality of magnetic elements 232 but that has a greater spatial extent and/or uniformity relative to the magnetic field produced by each magnetic element 232. As more specific examples, each magnetic element 232 may include and/or be a permanent magnet, a rare earth magnet, a neodymium magnet, a neodymium-iron-boron magnet, a samarium-cobalt magnet, an electromagnet, and/or a solenoid. Each magnetic element 232 may have any appropriate shape, such as a shape that at least substantially rectangular and/or square in a plane parallel to the respective field spreader 240. As additional examples, each field spreader 240 may be formed of a soft magnetic material, iron, an iron alloy, annealed iron, a silicon iron alloy, nickel, a nickel alloy, a permalloy, and/or an iron-nickel alloy that includes one or more of molybdenum and/or copper. As used herein, the term "soft magnetic material" is intended to refer to any appropriate material that is readily magnetized and demagnetized, such as to perform the functionality described herein.

The arranging each respective plurality of magnetic elements on each respective field spreader at 344 may be performed in any appropriate manner, such as to configure magnetic field 262 to be more uniform and/or larger in spatial extent than a magnetic field produced by each magnetic element 232. For example, and as schematically illustrated in FIGS. 3-6, each field spreader 240 may be described as having a first side 242 and a second side 244 (illustrated in FIGS. 3-4) opposite first side 242, and the arranging at 344 may include positioning each respective plurality of magnetic elements 232 on first side 242 of each respective field spreader 240. As another example, and as further schematically illustrated in FIGS. 3-4, the positioning first magnetic plate 230 and second magnetic plate 250 may include arranging first magnetic plate 230 and second magnetic plate 250 such that second side 244 of first magnetic plate 230 faces second side 244 of second magnetic plate 250. In such an arrangement, each plurality of magnetic elements 232 may face away from and/or be exterior of magnetic field region 260, such that a configuration of magnetic field 262 within magnetic field region 260 is substantially based upon a magnetization of each field spreader 240 by the respective plurality of magnetic elements 232. Stated differently, arranging first magnetic plate 230 and second magnetic plate 250 such that each plurality of magnetic elements 232 is exterior of magnetic field region 260 may yield a magnetic field 262 that is more spatially uniform relative to a configuration in which each plurality of magnetic elements 232 is positioned between field spreader 240 of first magnetic plate 230 and field spreader 240 of second magnetic plate 250.

As used herein, a given magnetic element 232 may be described as being "on" first side 242 of the respective field spreader 240 when magnetic element 232 is operatively maintained in a position relative to field spreader 240 such that field spreader 240 is at least partially magnetized by the magnetic field of magnetic element 232. In this manner, the arranging the magnetic elements at 344 may include arranging such that each magnetic element 232 is in contact with the respective field spreader 240, is spaced apart from the respective field spreader 240, and/or is at least partially retained in a position relative to the respective field spreader 240. In such configurations, magnetic element 232 also may be described as being operatively attached to the respective field spreader 240 and/or as being operatively coupled to the respective field spreader 240. Each magnetic element 232 may be operatively attached to the respective field spreader 240 in any appropriate manner, such as via an adhesive, welding, and/or a mechanical fastener. Additionally or alternatively, first side 242 of each field spreader 240 may include a plurality of slots and/or depressions for receiving the respective plurality of magnetic elements 232 and for at least partially retaining magnetic elements 232 in position relative to field spreader 240.

The arranging the magnetic elements at 344 may include positioning each respective plurality of magnetic elements 232 on each respective field spreader 240 in any appropriate manner and/or configuration. For example, and with reference to FIGS. 5-6, first side 242 of each field spreader 240 may have a respective field spreader area 246, and the arranging at 344 may include positioning each respective plurality of magnetic elements 232 on first side 242 of the respective field spreader 240 such that the plurality of magnetic elements 232 collectively cover an area that is at least 10% of field spreader area 246, at least 30% of field spreader area 246, at least 50% of field spreader area 246, at least 70% of field spreader area 246, at least 90% of field spreader area 246, at most 95% of field spreader area 246, at most 80% of field spreader area 246, at most 60% of field spreader area 246, at most 40% of field spreader area 246, and/or at most 20% of field spreader area 246. Additionally or alternatively, and with continued reference to FIGS. 5-6, each magnetic element 232 may be described as having a magnetic element area 238, as measured in a plane that is parallel to first side 242 of the respective field spreader 240 when magnetic element 232 is operatively attached to the respective field spreader 240. As examples, magnetic element area 238 of each magnetic element 232 may be at least 1 cm$^2$, at least 5 cm$^2$, at least 10 cm$^2$, at least 50 cm$^2$, at most 100 cm$^2$, at most 20 cm$^2$, at most 7 cm$^2$, and/or at most 2 cm$^2$. In some examples, the arranging at 344 includes distributing each respective plurality of magnetic elements 232 on each respective field spreader 240 such that each field spreader 240 produces a magnetic field at least on second side 244 of field spreader 240 that is at least substantially uniform.

In practice, while a larger areal coverage of field spreader area 246 by magnetic elements 232 may correspond to a stronger and/or more uniform magnetic field, such a configuration also may result in a stronger repulsive magnetic force between magnetic elements 232. This in turn may necessitate a stronger coupling between magnetic elements 232 and the respective field spreader 240 to maintain magnetic elements 232 in position relative to the respective field spreader 240. Accordingly, the arranging at 344 may include a determination of an optimal areal coverage of field spreader area 246 by magnetic elements 232 at least partially based upon such considerations. Each of FIGS. 5-6 schematically illustrates an example of an arrangement of magnetic elements 232 upon field spreader 240, such as may be based upon such considerations. Specifically, FIG. 5 schematically illustrates an example in which first magnetic plate 230 and/or second magnetic plate 250 includes a single row of spaced-apart magnetic elements 232 arranged on first side 242 of field spreader 240, while FIG. 6 schematically illustrates an example in which first magnetic plate 230 and/or second magnetic plate 250 includes two staggered rows of spaced-apart magnetic elements 232 arranged on first side 242 of field spreader 240. The staggered design of FIG. 6 may be particularly desirable in examples in which field spreader 240 is relatively large. For example, such a configuration may facilitate generating a substantially uniform magnetic field 262 over a relatively large spatial extent while mitigating repulsive magnetic forces between magnetic elements 232.

As discussed, and with reference to FIGS. 3-4, the arranging the magnetic elements at 344 and the positioning the magnetic plates at 346 generally include configuring first magnetic plate 230 and second magnetic plate 250 such that magnetic field 262 generated therebetween operates to produce an attractive magnetic force between first magnetic plate 230 and second magnetic plate 250. As a more specific example, and as schematically illustrated in FIGS. 3-4, each magnetic element 232 may be described as including a first pole 234 and a second pole 236, such that first pole 234 is one of a north pole or a south pole of magnetic element 232 and second pole 236 is the other of the north pole or the south pole. Accordingly, and as schematically illustrated in FIG. 3, the arranging at 344 may include positioning each magnetic element 232 such that first pole 234 of each magnetic element 232 corresponding to first magnetic plate 230 faces the respective field spreader 240 corresponding to first magnetic plate 230, and such that second pole 236 of each magnetic element 232 corresponding to second magnetic plate 250 faces the respective field spreader 240 corresponding to second magnetic plate 250. Thus, in an example in which first pole 234 is a north pole and second pole 236 is a south pole, the configuration of FIGS. 3-4 corresponds to a configuration in which the north pole of each magnetic element 232 corresponding to first magnetic plate 230 faces the south pole of each magnetic element 232 corresponding to second magnetic plate 250, thus producing an attractive magnetic force between first magnetic plate 230 and second magnetic plate 250.

In some examples, and as schematically illustrated in FIG. 3, the positioning the shielding sandwich assembly within the magnetic field region at 348 includes positioning shielding sandwich assembly 200 such that shielding sandwich assembly 200 is at least substantially parallel to each of first magnetic plate 230 and second magnetic plate 250 and such that shielding sandwich assembly 200 is at least substantially equidistant from each of first magnetic plate 230 and second magnetic plate 250. In this manner, and as schematically illustrated in FIG. 3, the positioning at 348 may include positioning shielding sandwich assembly 200 to be substantially perpendicular to magnetic field 262, such as to align each electrically conductive element 130 within shielding mixture 120 along a direction perpendicular to a plane of shielding sandwich assembly 200. Additionally, positioning shielding sandwich assembly 200 to be substantially equidistant from each of first magnetic plate 230 and second magnetic plate 250 may mitigate a tendency of electrically conductive elements 130 to preferentially migrate toward first magnetic plate 230 or toward second magnetic plate 250 due to magnetic field 262. Thus, positioning and/or maintaining shielding sandwich assembly 200 to be substantially equidistant from each of first magnetic plate 230 and second magnetic plate 250 generally facilitates maintaining a homogenous distribution of electrically conductive elements 130 within shielding mixture 120.

In some examples, and as further shown in FIG. 2, the magnetically aligning at 340 additionally includes, subsequent to the positioning the shielding assembly within the magnetic field region at 348, reducing, at 350, a plate separation distance (such as plate separation distance 252 schematically illustrated in FIGS. 3-4) between first magnetic plate 230 and second magnetic plate 250 to increase a magnitude of magnetic field 262 within magnetic field region 260. Accordingly, FIGS. 3-4 may be described as schematically illustrating aspects of method 300 prior to (FIG. 3) and subsequent to (FIG. 4) the reducing the plate separation distance at 350. Stated differently, the reducing the plate separation distance at 350 may describe a transition from the configuration of FIG. 3 to the configuration of FIG. 4.

As schematically illustrated in FIGS. 3-4, the reducing the plate separation distance at 350 to increase the magnitude of magnetic field 262 within magnetic field region 260 may produce and/or augment the effect of aligning electrically conductive elements 130 with one another. Specifically, because a torque applied to a given electrically conductive element 130 increases with the magnitude of the applied magnetic field 262 that produces the torque, increasing the magnitude of magnetic field 262 within magnetic field region 260 (such as via the reducing the plate separation distance at 350) may have the effect of increasing the torque applied to each electrically conductive element 130 to align each electrically conductive element 130 with magnetic field 262. As examples, the magnitude of magnetic field 262 within magnetic field region 260 may be at least 50 gauss, at least 100 gauss, at least 500 gauss, at least 1,000 gauss, at least 5,000 gauss, at most 10,000 gauss, at most 2,000 gauss, at most 700 gauss, at most 200 gauss, and/or at most 70 gauss, such as subsequent to the reducing the plate separation distance at 350. In some examples, the reducing the plate separation distance at 350 includes maintaining shielding sandwich assembly 200 at least substantially equidistant from each of first magnetic plate 230 and second magnetic plate 250, such as to prevent electrically conductive elements 130 from being preferentially magnetically attracted toward either of first magnetic plate 230 or second magnetic plate 250 during the reducing at 350.

The reducing the plate separation distance at 350 may correspond to moving any appropriate combination of first magnetic plate 230, second magnetic plate 250, and shielding sandwich assembly 200 relative to one another. As examples, the reducing at 350 may include moving first magnetic plate 230 relative to shielding sandwich assembly 200 and/or second magnetic plate 250, moving second magnetic plate 250 relative to shielding sandwich assembly 200 and/or first magnetic plate 230, and/or moving shielding sandwich assembly 200 relative to first magnetic plate 230 and/or second magnetic plate 250. In some examples, the reducing at 350 includes and/or concludes with bringing first magnetic plate 230 and/or second magnetic plate 250 into contact with shielding sandwich assembly 200.

While the examples described herein generally pertain to examples in which the magnitude of magnetic field 262 within magnetic field region 260 is increased via the reducing the plate separation distance at 350, it is additionally within the scope of the present disclosure that the magnitude of magnetic field 262 within magnetic field region 260 additionally or alternatively may be increased in any appropriate manner, such as by increasing a magnitude of the magnetic field produced by either or both of first magnetic plate 230 and second magnetic plate 250.

In some examples, and as further shown in FIG. 2, method 300 additionally includes, prior to the curing binding matrix material at 380, extruding, at 370, a portion of the binding matrix material from the shielding mixture within the magnetic field region. More specifically, the extruding at 370 may include removing a portion of binding matrix material 140 from magnetic field region 260 substantially without removing electrically conductive elements 130 from magnetic field region 260. That is, a magnetic interaction between electrically conductive elements 130 and magnetic field 262 within magnetic field region 260 may operate to at least partially retain electrically conductive elements 130 within magnetic field region 260 while binding matrix material 140 is extruded from magnetic field region 260. In this manner, the extruding at 370 may include and/or result in increasing the particle volume fraction of electrically conductive elements 130 in shielding mixture 120 that remains within magnetic field region 260. As more specific examples, the extruding at 370 may result in shielding mixture 120 having a particle volume fraction of electrically conductive elements 130 that is at least 10%, at least 30%, at least 50%, at least 70%, at least 90%, at most 95%, at most 80%, at most 60%, at most 40%, and/or at most 20%.

The extruding at 370 may be performed in any appropriate manner. For example, the extruding at 370 may include reducing confinement plate separation distance 202 between first mixture confinement plate 210 and second mixture confinement plate 212, such as by compressing shielding mixture 120 along a direction parallel to confinement plate separation distance 202, thereby pushing a portion of binding matrix material 140 out of magnetic field region 260. In some examples, and as schematically illustrated in FIGS. 3-4, each of first mixture confinement plate 210 and second mixture confinement plate 212 is wider than each of first magnetic plate 230 and second magnetic plate 250 such that binding matrix material 140 may be extruded from magnetic field region 260 while still being supported by and/or contained within shielding sandwich assembly 200. Stated differently, configuring each of first mixture confinement plate 210 and second mixture confinement plate 212 to be wider than each of first magnetic plate 230 and second magnetic plate 250 may facilitate keeping binding matrix material 140 from falling onto first magnetic plate 230 or second magnetic plate 250 during the extruding at 370.

The extruding at 370 may be performed at any appropriate step prior to the curing at 380, such as subsequent to the magnetically aligning the electrically conductive elements at 340, subsequent to the positioning the shielding sandwich assembly within the magnetic field region at 348, and/or subsequent to the reducing the plate separation distance at 350. In some examples in which the reducing the plate separation distance at 350 includes bringing first magnetic plate 230 and second magnetic plate 250 in contact with shielding sandwich assembly 200, the extruding at 370 includes compressing shielding mixture 120 at least partially via the attractive magnetic force between first magnetic plate 230 and second magnetic plate 250.

With continued reference to FIG. 2, in some examples of method 300 that include the placing the one or more shim spacers onto the first mixture confinement plate at 332, method 300 additionally includes, subsequent to the magnetically aligning the electrically conductive elements at 340, removing, at 360, at least a subset of the shim spacer(s) from the shielding sandwich assembly. For example, in an example of method 300 that includes the extruding at 370, the removing at 360 may be performed prior to the extruding at 370, such as to permit the portion of binding matrix material 140 to exit the region partially defined and/or enclosed by shim spacer(s) 204. In some examples, the placing the one or more shim spacers at 332 includes placing a plurality of shim spacers 204, and the removing at 360 includes removing fewer than all of shim spacers 204 from shielding sandwich assembly 200. For example, one or more of the plurality of shim spacers 204 may be sized to correspond to a desired panel thickness 114 of the resultant EMI shielding panel 100, and the removing at 360 may include maintaining one or more such shim spacers 204 within shielding sandwich assembly 200 such that the extruding at 370 results in shielding mixture 120 within magnetic field region 260 having a thickness that is substantially equal to the desired panel thickness 114.

As discussed, and as further shown in FIG. 2, method 300 additionally includes the curing the binding matrix material at 380. The curing at 380 may be performed in any appropriate manner. As examples, the curing at 380 may be performed at room temperature and/or at a temperature that is at least 30° C., at least 50° C., at least 100° C., at most 120° C., at most 70° C., and/or at most 40° C. In some examples, the curing at 380 is performed at least partially while shielding mixture 120 remains within magnetic field region 260, such as to maintain electrically conductive elements 130 in alignment with magnetic field 262 at least until shielding mixture 120 is sufficiently cured that electrically conductive elements 130 are substantially fixed in place within shielding mixture 120. As discussed, the curing at 380 generally includes curing binding matrix material 140 such that electrically conductive elements 130 are retained in alignment with respect to one another subsequent to removing shielding mixture 120 from magnetic field region 260. Accordingly, the curing at 380 generally includes curing binding matrix material 140 such that binding matrix material 140 at least partially solidifies to restrict electrically conductive elements 130 from moving relative to binding matrix material 140. In some examples, the curing at 380 additionally includes curing binding matrix material 140 such that binding matrix material 140 is flexible subsequent to the curing at 380.

Figure 7:
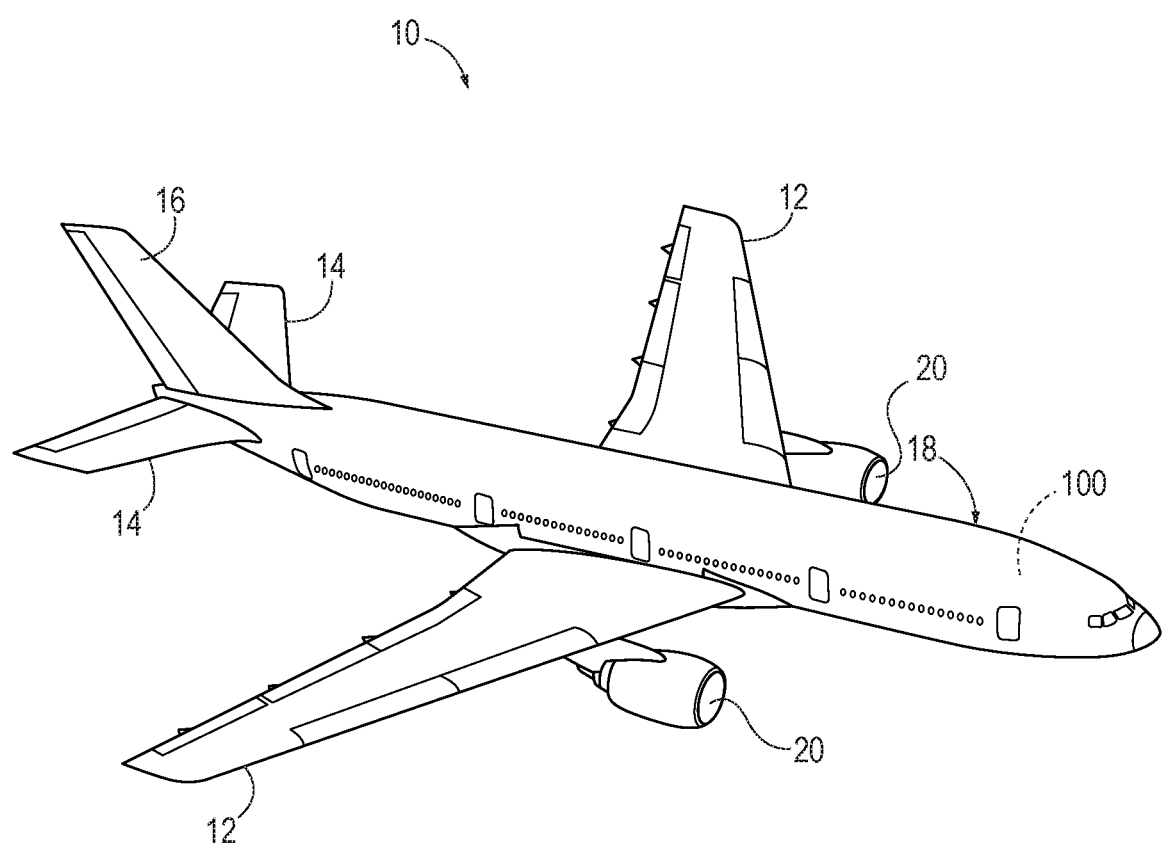
FIG. 7 is an illustration of an aircraft that may include and/or utilize EMI shielding panels according to the present disclosure.

FIG. 7 is an illustration of an aircraft 10 that may include and/or utilize EMI shielding panels 100 according to the present disclosure. As shown in FIG. 7, aircraft 10 may include one or more wings 12, a horizontal stabilizer 14, a vertical stabilizer 16, an airframe 18, and/or one or more turbofan engines 20. Examples of aircraft 10 include an airplane, a commercial aircraft, a passenger aircraft, and/or a military aircraft. Aircraft 10 may include and/or utilize EMI shielding panels 100 according to the present disclosure in any appropriate manner. For example, and as shown in FIG. 7, airframe 18 may include one or more EMI shielding panels 100.

Illustrative, non-exclusive examples of inventive subject matter according to the present disclosure are described in the following enumerated paragraphs:

A1. An electromagnetic interference (EMI) shielding panel (100), comprising:

a binding matrix material (140); and electrically conductive elements (130) distributed throughout the binding matrix material (140);

wherein each electrically conductive element (130) has a respective conductive element longitudinal axis (132), wherein the electrically conductive elements (130) are aligned such that the conductive element longitudinal axes (132) are at least substantially parallel to a shielding axis (106) of the EMI shielding panel (100), and wherein the electrically conductive elements (130) are configured to at least partially attenuate an incident electromagnetic (EM) wave that is incident upon the EMI shielding panel (100) along a direction that is at least partially parallel to the shielding axis (106).

A2. The EMI shielding panel (100) of paragraph A1, wherein the EMI shielding panel (100) extends substantially within a panel plane (102) that defines a panel transverse axis (104) that extends perpendicular to the panel plane (102), and wherein the shielding axis (106) is at least substantially parallel to the panel transverse axis (104).

A3. The EMI shielding panel (100) of any of paragraphs A1-A2, wherein the EMI shielding panel (100) has a panel thickness (114), as measured along a direction parallel to a/the panel transverse axis (104), that is one or more of at least 0.1 millimeters (mm), at least 0.5 mm, at least 1 mm, at least 5 mm, at least 10 mm, at most 15 mm, at most 7 mm, at most 2 mm, at most 0.7 mm, and at most 0.2 mm.

A4. The EMI shielding panel (100) of any of paragraphs A1-A3, wherein the EMI shielding panel (100) has a first linear dimension (110), as measured along a direction perpendicular to a/the panel transverse axis (104), and a second linear dimension (112), as measured along a direction perpendicular to each of the panel transverse axis (104) and the first linear dimension (110), and wherein one or both of the first linear dimension (110) and the second linear dimension (112) is one or more of at least 1 centimeter (cm), at least 3 cm, at least 5 cm, at least 10 cm, at least 15 cm, at least 20 cm, at least 30 cm, at least 50 cm, at least 100 cm, at most 200 cm, at most 75 cm, at most 40 cm, at most 25 cm, at most 17 cm, at most 12 cm, at most 7 cm, and at most 2 cm.

A5. The EMI shielding panel (100) of any of paragraphs A1-A4, wherein the EMI shielding panel (100) has a panel area, as measured in a/the panel plane (102), that is one or more of at least 1 cm$^2$, at least 10 cm$^2$, at least 100 cm$^2$, at least 1,000 cm$^2$, at least 10,000 cm$^2$, at most 50,000 cm$^2$, at most 5,000 cm$^2$, at most 500 cm$^2$, at most 50 cm$^2$, and at most 5 cm$^2$.

A6. The EMI shielding panel (100) of any of paragraphs A1-A5, wherein the EMI shielding panel (100) is configured to attenuate the incident EM wave by one or more of at least 10 decibels (dB), at least 20 dB, at least 30 dB, at least 60 dB, at least 80 dB, at most 100 dB, at most 70 dB, at most 50 dB, at most 25 dB, and at most 15 dB.

A7. The EMI shielding panel (100) of any of paragraphs A1-A6, wherein the EMI shielding panel (100) is configured to attenuate the incident EM wave when the incident EM wave has a wavelength that is one or more of at least 100 nanometers (nm), at least 1 micrometer (µm), at least 10 µm, at least 100 µm, at least 0.1 cm, at least 1 cm, at least 10 cm, at least 100 cm, at least 1 meter (m), at least 10 m, at least 100 m, at least 1 kilometer (km), at most 5 km, at most 500 m, at most 50 m, at most 5 m, at most 50 cm, at most 5 cm, at most 0.5 cm, at most 50 µm, at most 5 µm, and at most 500 nm.

A8. The EMI shielding panel (100) of any of paragraphs A1-A7, wherein the EMI shielding panel (100) is flexible, optionally resiliently flexible.

A9. The EMI shielding panel (100) of any of paragraphs A1-A8, wherein each electrically conductive element (130) is formed of one or more of a wire, a magnetic material, a paramagnetic material, a ferromagnetic material, iron, nickel, a permalloy, an iron silicon alloy, cobalt, and an iron cobalt alloy.

A10. The EMI shielding panel (100) of any of paragraphs A1-A9, wherein each electrically conductive element (130) has an electrical conductivity that is one or more of at least 100 siemens per meter (S/m), at least 1,000 S/m, at least 10,000 S/m, at least 100,000 S/m, at least 1,000,000 S/m, at least 10,000,000 S/m, at least 100,000,000 S/m, at most 500,000,000 S/m, at most 50,000,000 S/m, at most 5,000,000 S/m, at most 500,000 S/m, at most 50,000 S/m, at most 5,000 S/m, and at most 500 S/m.

A11. The EMI shielding panel (100) of any of paragraphs A1-A10, wherein each electrically conductive element (130) has a conductive element length (134), as measured along a direction parallel to the respective conductive element longitudinal axis (132), that is one or more of at least 10 µm, at least 50 µm, at least 100 µm, at least 500 µm, at least 1 mm, at most 5 mm, at most 700 µm, at most 200 µm, at most 70 µm, and at most 20 µm.

A12. The EMI shielding panel (100) of any of paragraphs A1-A11, wherein each electrically conductive element (130) has a conductive element diameter (136), as measured along a direction perpendicular to the respective conductive element longitudinal axis (132), that is one or more of at least 100 nm, at least 500 nm, at least 1 µm, at least 5 µm, at least 10 µm, at least 50 µm, at least 100 µm, at least 500 µm, at most 1 mm, at most 700 µm, at most 200 µm, at most 70 µm, at most 20 µm, at most 7 µm, at most 2 µm, at most 700 nm, and at most 200 nm.

A13. The EMI shielding panel (100) of any of paragraphs A1-A12, wherein each electrically conductive element (130) has a conductive element aspect ratio that is one or more of at least 2:1, at least 5:1, at least 10:1, at least 50:1, at least 100:1, at least 500:1, at least 1,000:1, at most 2,000:1, at most 700:1, at most 200:1, at most 70:1, at most 20:1, at most 7:1, and at most 3:1.

A14. The EMI shielding panel (100) of paragraph A13, wherein the conductive element aspect ratio of each electrically conductive element (130) is defined as a ratio of a/the conductive element length (134) of the electrically conductive element (130) to a/the conductive element diameter (136) of the electrically conductive element (130).

A15. The EMI shielding panel (100) of any of paragraphs A1-A14, wherein each electrically conductive element (130) is at least substantially coated by a non-conductive layer (131) that at least substantially electrically insulates the electrically conductive elements (130) from one another.

A16. The EMI shielding panel (100) of paragraph A15, wherein the non-conductive layer (131) includes one or more of a thin film, a cellulosic material, carboxymethyl cellulose, hydropropyl cellulose, hydroxypropyl methyl cellulose, and polyvinylpyrrolidone.

A17. The EMI shielding panel (100) of any of paragraphs A15-A16, wherein the non-conductive layer (131) has a thickness that is at least substantially uniform around an exterior surface of each electrically conductive element (130).

A18. The EMI shielding panel (100) of any of paragraphs A15-A17, wherein the non-conductive layer (131) has a thickness that is one or more of at least 0.1 µm, at least 0.3 µm, at least 0.5 µm, at least 1 µm, at least 3 µm, at least 5 µm, at least 10 µm, at least 30 µm, at most 50 µm, at most 20 µm, at most 7 µm, at most 2 µm, at most 0.7 µm, and at most 0.2 µm.

A19. The EMI shielding panel (100) of any of paragraphs A1-A18, wherein the binding matrix material (140) includes one or more of a dielectric material, a polymer, a resin, an epoxy resin, a curable epoxy resin, and a low-viscosity epoxy resin.

A20. The EMI shielding panel (100) of any of paragraphs A1-A19, wherein the electrically conductive elements (130) are at least substantially evenly distributed throughout the binding matrix material (140).

A21. The EMI shielding panel (100) of any of paragraphs A1-A20, wherein the EMI shielding panel (100) has a conductive element mass fraction, defined as a proportion of a total mass of the EMI shielding panel (100) that is formed by the electrically conductive elements (130), that is one or more of at least 1%, at least 3%, at least 5%, at least 10%, at least 15%, at least 20%, at least 30%, at most 50%, at most 25%, at most 17%, at most 12%, at most 7%, and at most 2%.

A22. The EMI shielding panel (100) of any of paragraphs A1-A21, wherein the electrically conductive elements (130) are at least partially spaced apart from each other.

A23. An aircraft (10) comprising the EMI shielding panel (100) of any of paragraphs A1-A22.

A24. The use of the EMI shielding panel (100) of any of paragraphs A1-A22 to at least partially attenuate an incident EM wave that is incident upon the EMI shielding panel (100).

B1. A method (300) of forming an EMI shielding panel (100), the method (300) comprising:

providing (310) a shielding mixture (120) that includes electrically conductive elements (130) distributed throughout an uncured binding matrix material (140);

magnetically aligning (340) the electrically conductive elements (130), wherein each electrically conductive element (130) has a conductive element longitudinal axis (132), and wherein the magnetically aligning (340) the electrically conductive elements (130) includes aligning the electrically conductive elements (130) such that the conductive element longitudinal axes (132) are at least substantially parallel to one another; and curing (380) the binding matrix material (140) to form an EMI shielding panel (100).

B2. The method (300) of paragraph B1, wherein the EMI shielding panel (100) is the EMI shielding panel (100) of any of paragraphs A1-A22.

B3. The method (300) of any of paragraphs B1-B2, further comprising, prior to the magnetically aligning (340) the electrically conductive elements (130), positioning (330) the shielding mixture (120) between a first mixture confinement plate (210) and a second mixture confinement plate (212) to yield a shielding sandwich assembly (200) that includes the shielding mixture (120) positioned between the first mixture confinement plate (210) and the second mixture confinement plate (212).

B4. The method (300) of paragraph B3, wherein one or both of the first mixture confinement plate (210) and the second mixture confinement plate (212) is a glass plate.

B5. The method (300) of any of paragraphs B3-B4, wherein the positioning (330) the shielding mixture (120) between the first mixture confinement plate (210) and the second mixture confinement plate (212) includes:

placing (332) one or more shim spacers (204) onto the first mixture confinement plate (210);

depositing (334) the shielding mixture (120) onto the first mixture confinement plate (210); and positioning (336) the second mixture confinement plate (212) such that the second mixture confinement plate (212) is in contact with at least a subset of the one or more shim spacers (204) and with the shielding mixture (120).

B6. The method (300) of paragraph B5, wherein the placing (332) the one or more shim spacers (204) includes at least substantially surrounding the shielding mixture (120) with the one or more shim spacers (204).

B7. The method (300) of any of paragraphs B5-B6, wherein each shim spacer (204) of the one or more shim spacers (204) is one or more of porous, nonporous, rigid, and compressible.

B8. The method (300) of any of paragraphs B5-B7, wherein the one or more shim spacers (204) are configured to maintain a confinement plate separation distance (202) between the first mixture confinement plate (210) and the second mixture confinement plate (212) that is one or more of at least 0.1 mm, at least 0.5 mm, at least 1 mm, at least 5 mm, at least 1 cm, at least 5 cm, at least 10 cm, at most 15 cm, at most 7 cm, at most 2 cm, at most 7 mm, at most 2 mm, at most 0.7 mm, and at most 0.2 mm.

B9. The method (300) of any of paragraphs B5-B8, wherein the positioning (330) the shielding mixture (120) between the first mixture confinement plate (210) and the second mixture confinement plate (212) further includes, prior to the depositing (334) the shielding mixture (120) onto the first mixture confinement plate (210), treating the first mixture confinement plate (210) with a mold release.

B10. The method (300) of any of paragraphs B5-B9, wherein the positioning (330) the shielding mixture (120) between the first mixture confinement plate (210) and the second mixture confinement plate (212) further includes, prior to the positioning (336) the second mixture confinement plate (212), treating the second mixture confinement plate (212) with a/the mold release.

B11. The method (300) of any of paragraphs B5-B10, wherein the positioning (336) the second mixture confinement plate (212) includes tilting the second mixture confinement plate (212) from an orientation in which the second mixture confinement plate (212) is oblique to the first mixture confinement plate (210) to an orientation in which the second mixture confinement plate (212) is substantially parallel to the first mixture confinement plate (210).

B12. The method (300) of any of paragraphs B5-B11, wherein the positioning (336) the second mixture confinement plate (212) includes contacting the shielding mixture (120) with the second mixture confinement plate (212) such that a region defined by the first mixture confinement plate (210), the second mixture confinement plate (212), and the one or more shim spacers (204) is substantially free of voids.

B13. The method (300) of any of paragraphs B1-B12, wherein the providing (310) the shielding mixture (120) includes pre-treating (312) the electrically conductive elements (130) with a non-conductive layer (131).

B14. The method (300) of paragraph B13, wherein the pre-treating (312) the electrically conductive elements (130) with the non-conductive layer (131) includes coating each of the electrically conductive elements (130) with the non-conductive layer (131) such that the electrically conductive elements (130) are at least substantially electrically insulated from one another.

B15. The method (300) of any of paragraphs B13-B14, wherein the pre-treating (312) the electrically conductive elements (130) with the non-conductive layer (131) includes coating each of the electrically conductive elements (130) with the non-conductive layer (131) such that a thickness of the non-conductive layer (131) on each of the electrically conductive elements (130) is at least substantially uniform.

B16. The method (300) of any of paragraphs B13-B15, wherein the pre-treating (312) the electrically conductive elements (130) with the non-conductive layer (131) includes applying the non-conductive layer (131) to the electrically conductive elements (130) via a Wurster fluid bed process.

B17. The method (300) of any of paragraphs B1-B16, wherein the providing (310) the shielding mixture (120) includes mixing (314) the electrically conductive elements (130) and the binding matrix material (140).

B18. The method (300) of paragraph B17, wherein the mixing (314) the electrically conductive elements (130) and the binding matrix material (140) is performed with one or more of a centrifugal mixer, a dispersion disc, a paddle mixer, and an ultrasonic mixer.

B19. The method (300) of any of paragraphs B17-B18, when dependent from paragraph B13, wherein the mixing (314) the electrically conductive elements (130) and the binding matrix material (140) is performed subsequent to the pre-treating (312) the electrically conductive elements (130) with the non-conductive layer.

B20. The method (300) of any of paragraphs B1-B19, wherein the shielding mixture (120) has a conductive element particle volume fraction of the electrically conductive elements (130), defined as a proportion of a total volume of the shielding mixture (120) that is formed by the electrically conductive elements (130), that is one or more of at least 5%, at least 10%, at least 30%, at least 50%, at most 60%, at most 40%, at most 20%, and at most 7%.

B21. The method (300) of any of paragraphs B1-B20, wherein the shielding mixture (120) has a conductive element mixture mass fraction, defined as a proportion of a total mass of the shielding mixture (120) that is formed by the electrically conductive elements (130), that is one or more of at least 1%, at least 3%, at least 5%, at least 10%, at least 15%, at least 20%, at least 30%, at most 50%, at most 25%, at most 17%, at most 12%, at most 7%, and at most 2%.

B22. The method (300) of any of paragraphs B1-B21, wherein the shielding mixture (120) has a viscosity that is one or more of at least 10 centiPoise, at least 100 centiPoise, at least 1,000 centiPoise, at least 10,000 centiPoise, at most 50,000 centiPoise, at most 5,000 centiPoise, at most 500 centiPoise, and at most 50 centiPoise.

B23. The method (300) of any of paragraphs B1-B22, wherein the shielding mixture (120) includes a curative.

B24. The method (300) of any of paragraphs B1-B23, further comprising, prior to the magnetically aligning (340) the electrically conductive elements (130), degassing (320) the shielding mixture (120).

B25. The method (300) of paragraph B24, wherein the degassing (320) the shielding mixture (120) is performed at room temperature.

B26. The method (300) of any of paragraphs B24-B25, wherein the degassing (320) the shielding mixture (120) is performed at a temperature that is one or more of at least 30° C., at least 50° C., at least 100° C., at most 120° C., at most 70° C., and at most 40° C.

B27. The method (300) of any of paragraphs B24-B26, wherein the degassing (320) the shielding mixture (120) includes applying a vacuum to the shielding mixture (120).

B28. The method (300) of any of paragraphs B1-B27, wherein the magnetically aligning (340) the electrically conductive elements (130) includes:

positioning (346) a first magnetic plate (230) and a second magnetic plate (250) to produce a magnetic field (262) within a magnetic field region (260) that extends between the first magnetic plate (230) and the second magnetic plate (250), wherein the magnetic field (262) yields an attractive magnetic force between the first magnetic plate (230) and the second magnetic plate (250); and positioning (348) a/the shielding sandwich assembly (200) within the magnetic field region (260).

B29. The method (300) of paragraph B28, wherein the positioning (346) the first magnetic plate (230) and the second magnetic plate (250) further includes positioning the first magnetic plate (230) and the second magnetic plate (250) such that the first magnetic plate (230) and the second magnetic plate (250) are at least substantially parallel to one another and such that the magnetic field (262) between the first magnetic plate (230) and the second magnetic plate (250) biases the first magnetic plate (230) and the second magnetic plate (250) toward one another.

B30. The method (300) of any of paragraphs B28-B29, further comprising, prior to the positioning the first magnetic plate (230) and the second magnetic plate (250) at 346, preparing (342) the first magnetic plate (230) and the second magnetic plate (250).

B31. The method (300) of paragraph B30, wherein each of the first magnetic plate (230) and the second magnetic plate (250) includes a respective field spreader (240) and a respective plurality of magnetic elements (232) positioned on the respective field spreader (240), and wherein the preparing (342) the first magnetic plate (230) and the second magnetic plate (250) includes arranging (344) each respective plurality of magnetic elements (232) on each respective field spreader (240).

B32. The method (300) of paragraph B31, wherein each magnetic element (232) of each respective plurality of magnetic elements (232) includes a first pole (234) and a second pole (236), wherein the first pole (234) is one of a north pole and a south pole, wherein the second pole (236) is the other of the north pole and the south pole, and wherein the arranging (344) each respective plurality of magnetic elements (232) on each respective field spreader (240) includes positioning each magnetic element (232) of each respective plurality of magnetic elements (232) such that the first pole (234) of each magnetic element (232) corresponding to the first magnetic plate (230) faces the respective field spreader (240) corresponding to the first magnetic plate (230) and such that the second pole (236) of each magnetic element (232) corresponding to the second magnetic plate (250) faces the respective field spreader (240) corresponding to the second magnetic plate (250).

B33. The method (300) of any of paragraphs B31-B32, wherein each respective field spreader (240) includes a first side (242) and a second side (244) opposite the first side (242), and wherein the arranging (344) each respective plurality of magnetic elements (232) on each respective field spreader (240) includes positioning each respective plurality of magnetic elements (232) on the first side (242) of each respective field spreader (240).

B34. The method (300) of paragraph B33, wherein the positioning (346) the first magnetic plate (230) and the second magnetic plate (250) includes arranging the first magnetic plate (230) and the second magnetic plate (250) such that the second side (244) of the first magnetic plate (230) faces the second side (244) of the second magnetic plate (250).

B35. The method (300) of any of paragraphs B33-B34, wherein the first side (242) of each respective field spreader (240) has a respective field spreader area (246), and wherein the arranging (344) each respective plurality of magnetic elements (232) on each respective field spreader (240) includes positioning each respective plurality of magnetic elements (232) on the first side (242) of the respective field spreader (240) such that the respective plurality of magnetic elements (232) collectively cover an area that is one or more of at least 10% of the field spreader area (246), at least 30% of the field spreader area (246), at least 50% of the field spreader area (246), at least 70% of the field spreader area (246), at least 90% of the field spreader area (246), at most 95% of the field spreader area (246), at most 80% of the field spreader area (246), at most 60% of the field spreader area (246), at most 40% of the field spreader area (246), and at most 20% of the field spreader area (246).

B36. The method (300) of any of paragraphs B31-B35, wherein the arranging (344) each respective plurality of magnetic elements (232) on each respective field spreader (240) includes distributing each respective plurality of magnetic elements (232) on each respective field spreader (240) such that each field spreader (240) produces the magnetic field (262) at least on the second side (244) of each respective field spreader (240) that is at least substantially uniform.

B37. The method (300) of any of paragraphs B31-B36, wherein each respective field spreader (240) is formed of one or more of a soft magnetic material, iron, an iron alloy, annealed iron, a silicon iron alloy, nickel, and a nickel alloy, a permalloy, an iron-nickel alloy that includes one or more of molybdenum and copper.

B38. The method (300) of any of paragraphs B31-B37, wherein each magnetic element (232) of each respective plurality of magnetic elements (232) includes one or more of a permanent magnet, a rare earth magnet, a neodymium magnet, a neodymium-iron-boron magnet, a samarium-cobalt magnet, an electromagnet, and a solenoid.

B39. The method (300) of any of paragraphs B31-B38, wherein each magnetic element (232) of each respective plurality of magnetic elements (232) has a magnetic element area (238), as measured in a plane that is parallel to the first side (242) of the respective field spreader (240) when the magnetic element (232) is operatively attached to the respective field spreader (240), that is one or more of at least 1 cm$^2$, at least 5 cm$^2$, at least 10 cm$^2$, at least 50 cm$^2$, at most 100 cm$^2$, at most 20 cm$^2$, at most 7 cm$^2$, and at most 2 cm$^2$.

B40. The method (300) of any of paragraphs B28-B39, wherein the positioning (348) the shielding sandwich assembly (200) within the magnetic field region (260) includes positioning the shielding sandwich assembly (200) such that the shielding sandwich assembly (200) is at least substantially parallel to each of the first magnetic plate (230) and the second magnetic plate (250) and such that the shielding sandwich assembly (200) is at least substantially equidistant from each of the first magnetic plate (230) and the second magnetic plate (250).

B41. The method (300) of any of paragraphs B28-B40, wherein the magnetically aligning (340) the electrically conductive elements (13) further includes, subsequent to the positioning (348) the shielding sandwich assembly (200) within the magnetic field region (260), reducing (350) a plate separation distance (252) between the first magnetic plate (230) and the second magnetic plate (250) to increase a magnitude of the magnetic field (262) within the magnetic field region (260).

B42. The method (300) of paragraph B41, wherein, subsequent to the reducing (350) the plate separation distance (252), the magnitude of the magnetic field (262) within the magnetic field region (260) is one or more of at least 50 gauss, at least 100 gauss, at least 500 gauss, at least 1,000 gauss, at least 5,000 gauss, at most 10,000 gauss, at most 2,000 gauss, at most 700 gauss, at most 200 gauss, and at most 70 gauss.

B43. The method (300) of any of paragraphs B41-B42, wherein the reducing (350) the plate separation distance (252) includes one or more of:
  (i) moving the first magnetic plate (230) relative to one or both of the shielding sandwich assembly (200) and the second magnetic plate (250);
  (ii) moving the second magnetic plate (250) relative to one or both of the shielding sandwich assembly (200) and the first magnetic plate (230); and
  (iii) moving the shielding sandwich assembly (200) relative to one or both of the first magnetic plate (230) and the second magnetic plate (250).

B44. The method (300) of any of paragraphs B41-B43, wherein the reducing (350) the plate separation distance (252) includes maintaining the shielding sandwich assembly (200) at least substantially equidistant from each of the first magnetic plate (230) and the second magnetic plate (250) as the plate separation distance (252) is reduced.

B45. The method (300) of any of paragraphs B41-B44, wherein the reducing (350) the plate separation distance (252) includes bringing one or both of the first magnetic plate (230) and the second magnetic plate (250) into contact with the shielding sandwich assembly (200).

B46. The method (300) of any of paragraphs B1-B45, further comprising, subsequent to the magnetically aligning (340) the electrically conductive elements (130), removing (360) at least a subset of the one or more shim spacers (204) from the shielding sandwich assembly (200).

B47. The method (300) of paragraph B46, wherein the removing (360) the at least one of the one or more shim spacers (204) includes removing fewer than all of the shim spacers (204).

B48. The method (300) of any of paragraphs B1-B47, further comprising, prior to the curing (380) the binding matrix material (140), extruding (370) a portion of the binding matrix material (140) from the shielding mixture (120) within the magnetic field region (260).

B49. The method (300) of paragraph B48, when dependent from paragraph B40, wherein the removing (360) the at least the subset of the one or more shim spacers (204) from the shielding sandwich assembly (200) is performed prior to the extruding (370) the portion of the binding matrix material (140).

B50. The method (300) of any of paragraphs B48-B49, wherein the extruding (370) the portion of the binding matrix material (140) is performed subsequent to the positioning (348) the shielding sandwich assembly (200) within the magnetic field region (260).

B51. The method (300) of any of paragraphs B48-B50, when dependent from paragraph B28, wherein the extruding (370) the portion of the binding matrix material (140) includes compressing the shielding mixture (120) at least partially via the attractive magnetic force between the first magnetic plate (230) and the second magnetic plate (250).

B52. The method (300) of any of paragraphs B48-B51, when dependent from paragraph B28, wherein the extruding (370) the portion of the binding matrix material (140) includes removing a portion of the binding matrix material (140) from the magnetic field region (260) substantially without removing the electrically conductive elements (130) from the magnetic field region (260).

B53. The method (300) of any of paragraphs B48-B52, when dependent from paragraph B28, wherein the extruding (370) the portion of the binding matrix material (140) includes increasing a/the particle volume fraction of the electrically conductive elements (130) in the shielding mixture (120) that remains within the magnetic field region (260).

B54. The method (300) of any of paragraphs B48-B53, when dependent from paragraph B28, wherein the extruding (370) the portion of the binding matrix material (140) results in the shielding mixture (120) that remains within the magnetic field region (260) having a/the particle volume fraction of the electrically conductive elements (130) that is one or more of at least 10%, at least 30%, at least 50%, at least 70%, at least 90%, at most 95%, at most 80%, at most 60%, at most 40%, and at most 20%.

B55. The method (300) of any of paragraphs B1-B54, when dependent from paragraph B28, wherein the curing (380) the binding matrix material (140) is at least partially performed while the shielding mixture (120) remains within the magnetic field region (260).

B56. The method (300) of any of paragraphs B1-B55, wherein the curing (380) the binding matrix material (140) is at least partially performed at room temperature.

B57. The method (300) of any of paragraphs B1-B56, wherein the curing (380) the binding matrix material (140) is at least partially performed at a temperature that is one or more of at least 30° C., at least 50° C., at least 100° C., at least 150° C., at least 200° C., at least 300° C., at most 400° C., at most 250° C., at most 170° C., at most 120° C., at most 70° C., and at most 40° C.

B58. The method (300) of any of paragraphs B1-B57, wherein the curing (380) the binding matrix material (140) includes curing the binding matrix material (140) such that the binding matrix material (140) at least partially solidifies to restrict the electrically conductive elements (130) from moving relative to the binding matrix material (140).

B59. The method (300) of any of paragraphs B1-B58, wherein the curing (380) the binding matrix material (140) includes curing the binding matrix material (140) such that the binding matrix material (140) is flexible subsequent to the curing (380).

As used herein, the phrase "at least substantially," when modifying a degree or relationship, includes not only the recited "substantial" degree or relationship, but also the full extent of the recited degree or relationship. A substantial amount of a recited degree or relationship may include at least 75% of the recited degree or relationship. For example, a first direction that is at least substantially parallel to a second direction includes a first direction that is within an angular deviation of 22.5° relative to the second direction and also includes a first direction that is identical to the second direction.

As used herein, the terms "selective" and "selectively," when modifying an action, movement, configuration, or other activity of one or more components or characteristics of an apparatus, mean that the specific action, movement, configuration, or other activity is a direct or indirect result of one or more dynamic processes, as described herein. The terms "selective" and "selectively" thus may characterize an activity that is a direct or indirect result of user manipulation of an aspect of, or one or more components of, the apparatus, or may characterize a process that occurs automatically, such as via the mechanisms disclosed herein.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the term "and/or" placed between a first entity and a second entity means one of (1) the first entity, (2) the second entity, and (3) the first entity and the second entity. Multiple entries listed with "and/or" should be construed in the same manner, i.e., "one or more" of the entities so conjoined. Other entities optionally may be present other than the entities specifically identified by the "and/or" clause, whether related or unrelated to those entities specifically identified. Thus, as a non-limiting example, a reference to "A and/or B," when used in conjunction with open-ended language such as "comprising," may refer, in one example, to A only (optionally including entities other than B); in another example, to B only (optionally including entities other than A); in yet another example, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order, concurrently, and/or repeatedly. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

The various disclosed elements of apparatuses and systems and steps of methods disclosed herein are not required to all apparatuses, systems, and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus, system, or method. Accordingly, such inventive subject matter is not required to be associated with the specific apparatuses, systems, and methods that are expressly disclosed herein and such inventive subject matter may find utility in apparatuses, systems, and/or methods that are not expressly disclosed herein.

The invention claimed is:

1. A method of forming an electromagnetic interference (EMI) shielding panel, the method comprising:
providing a shielding mixture that includes electrically conductive elements distributed throughout an uncured binding matrix material;
positioning the shielding mixture between a first mixture confinement plate and a second mixture confinement plate to yield a shielding sandwich assembly that includes the shielding mixture positioned between the first mixture confinement plate and the second mixture confinement plate;
magnetically aligning the electrically conductive elements, wherein each electrically conductive element has a conductive element longitudinal axis, and wherein the magnetically aligning the electrically conductive elements includes aligning the electrically conductive elements such that the conductive element longitudinal axes are at least substantially parallel to one another; and
curing the binding matrix material to form the EMI shielding panel;
wherein the magnetically aligning the electrically conductive elements includes:
positioning a first magnetic plate and a second magnetic plate to produce a magnetic field within a magnetic field region that extends between the first magnetic plate and the second magnetic plate, wherein the magnetic field produces an attractive magnetic force between the first magnetic plate and the second magnetic plate;
positioning the shielding sandwich assembly within the magnetic field region; and
reducing a plate separation distance between the first magnetic plate and the second magnetic plate to increase a magnitude of the magnetic field within the magnetic field region; and
wherein the positioning the shielding mixture between the first mixture confinement plate and the second mixture confinement plate is performed prior to the magnetically aligning the electrically conductive elements.

2. The method of claim 1, wherein the providing the shielding mixture includes pre-treating the electrically conductive elements with a non-conductive layer, and wherein the pre-treating the electrically conductive elements with the non-conductive layer includes coating each of the electrically conductive elements with the non-conductive layer such that the electrically conductive elements are at least substantially electrically insulated from one another.

3. The method of claim 1, wherein the positioning the first magnetic plate and the second magnetic plate further includes positioning the first magnetic plate and the second magnetic plate such that the first magnetic plate and the second magnetic plate are at least substantially parallel to one another and such that the magnetic field between the first magnetic plate and the second magnetic plate biases the first magnetic plate and the second magnetic plate toward one another.

4. The method of claim 1, further comprising, prior to the positioning the first magnetic plate and the second magnetic plate, preparing the first magnetic plate and the second magnetic plate, wherein each of the first magnetic plate and the second magnetic plate includes a respective field spreader and a respective plurality of magnetic elements positioned on the respective field spreader, and wherein the preparing the first magnetic plate and the second magnetic plate includes arranging each respective plurality of magnetic elements on each respective field spreader.

5. The method of claim 4, wherein each magnetic element of each respective plurality of magnetic elements includes a first pole and a second pole, wherein the first pole is one of a north pole and a south pole, wherein the second pole is the other of the north pole and the south pole, and wherein the arranging each respective plurality of magnetic elements on each respective field spreader includes positioning each magnetic element of the respective plurality of magnetic elements such that the first pole of each magnetic element corresponding to the first magnetic plate faces the respective field spreader corresponding to the first magnetic plate and such that the second pole of each magnetic element corresponding to the second magnetic plate faces the respective field spreader corresponding to the second magnetic plate.

6. The method of claim 4, wherein each respective field spreader includes a first side and a second side opposite the first side, wherein the arranging each respective plurality of magnetic elements on each respective field spreader includes positioning each respective plurality of magnetic elements on the first side of each respective field spreader, and wherein the arranging each respective plurality of magnetic elements on each respective field spreader includes distributing each respective plurality of magnetic elements on each respective field spreader such that each field spreader produces the magnetic field at least on the second side of each respective field spreader that is at least substantially uniform.

7. The method of claim 4, wherein the positioning the shielding sandwich assembly within the magnetic field region includes positioning the shielding sandwich assembly such that the shielding sandwich assembly is at least substantially parallel to each of the first magnetic plate and the second magnetic plate and such that the shielding sandwich assembly is at least substantially equidistant from each of the first magnetic plate and the second magnetic plate.

8. The method of claim 1, wherein the reducing the plate separation distance includes maintaining the shielding sandwich assembly at least substantially equidistant from each of the first magnetic plate and the second magnetic plate as the plate separation distance is reduced.

9. The method of claim 1, further comprising, prior to the curing the binding matrix material, extruding a portion of the binding matrix material from the shielding mixture within the magnetic field region, wherein the extruding the portion of the binding matrix material is performed subsequent to the positioning the shielding sandwich assembly within the magnetic field region, wherein the extruding the portion of the binding matrix material includes compressing the shielding mixture at least partially via the attractive magnetic force between the first magnetic plate and the second magnetic plate, and wherein the extruding the portion of the binding matrix material includes removing a portion of the binding matrix material from the magnetic field region substantially without removing the electrically conductive elements from the magnetic field region.

10. The method of claim 9, wherein the extruding the portion of the binding matrix material includes increasing a particle volume fraction of the electrically conductive elements in the shielding mixture that remains within the magnetic field region.

11. The method of claim 1, wherein the curing the binding matrix material is at least partially performed while the shielding mixture remains within the magnetic field region.

12. The method of claim 1, wherein the positioning the shielding mixture between the first mixture confinement plate and the second mixture confinement plate includes:
   placing one or more shim spacers onto the first mixture confinement plate;
   depositing the shielding mixture onto the first mixture confinement plate; and
   positioning the second mixture confinement plate such that the second mixture confinement plate is in contact with at least a subset of the one or more shim spacers and with the shielding mixture.

13. The method of claim 1, further comprising, prior to the magnetically aligning the electrically conductive elements, degassing the shielding mixture.

14. An EMI shielding panel formed via the method of claim 1, the EMI shielding panel comprising:
   the binding matrix material; and
   the electrically conductive elements distributed throughout the binding matrix material;
   wherein the electrically conductive elements are aligned such that the conductive element longitudinal axes are at least substantially parallel to a shielding axis of the EMI shielding panel, wherein the electrically conductive elements are configured to at least partially attenuate an incident electromagnetic (EM) wave that is incident upon the EMI shielding panel along a direction that is at least partially parallel to the shielding axis, wherein the EMI shielding panel extends substantially within a panel plane that defines a panel transverse axis that extends perpendicular to the panel plane, wherein the shielding axis is at least substantially parallel to the panel transverse axis, and wherein the EMI shielding panel is flexible.

15. The EMI shielding panel of claim 14, wherein the EMI shielding panel is configured to attenuate the incident EM wave by one or more of at least 10 decibels (dB) and at most 100 dB.

16. The EMI shielding panel of claim 14, wherein each electrically conductive element is formed of one or more of a wire, a magnetic material, a paramagnetic material, a ferromagnetic material, iron, nickel, a permalloy, an iron silicon alloy, cobalt, and an iron cobalt alloy.

17. The EMI shielding panel of claim 14, wherein the binding matrix material includes one or more of a dielectric material, a polymer, a resin, an epoxy resin, a curable epoxy resin, and a low-viscosity epoxy resin.

18. The EMI shielding panel of claim 14, wherein the electrically conductive elements are at least substantially evenly distributed throughout the binding matrix material.

19. The EMI shielding panel of claim 14, wherein each electrically conductive element is at least substantially coated by a non-conductive layer that at least substantially electrically insulates the electrically conductive elements from one another.

20. An aircraft including the EMI shielding panel of claim 14.

* * * * *